United States Patent [19]
Matsuoka

[11] Patent Number: 5,488,253
[45] Date of Patent: Jan. 30, 1996

[54] SEMICONDUCTOR DEVICE

[75] Inventor: Hiroshi Matsuoka, Hyogo, Japan

[73] Assignee: Mitsubishi Denki Kabushiki Kaisha, Tokyo, Japan

[21] Appl. No.: 336,059

[22] Filed: Nov. 4, 1994

[30] Foreign Application Priority Data

Nov. 10, 1993 [JP] Japan .................................. 5-280765

[51] Int. Cl.$^6$ ........................... H01L 29/06; H01L 23/48; H01L 23/52; H01L 29/40
[52] U.S. Cl. ........................ 257/622; 257/482; 257/773
[58] Field of Search .................................... 257/621, 622, 257/623, 467, 419, 469, 482, 773

[56] References Cited

U.S. PATENT DOCUMENTS

| | | | |
|---|---|---|---|
| 4,876,176 | 10/1989 | Calviello et al. | 257/622 |
| 5,084,750 | 1/1992 | Alderstein | 257/622 |
| 5,343,071 | 8/1994 | Kazior | 257/621 |
| 5,347,149 | 9/1994 | Bayraktaroglu | 257/192 |
| 5,399,897 | 3/1995 | Cunningham et al. | 257/467 |

OTHER PUBLICATIONS

McCormack et al, "A GaAs MSI 8–Bit Multiplexer and Demultiplexer", IEEE GaAs IC Symposium, 1982, pp. 25–26.

T. Andrade, "Fabrication Technique of GaAs Monolithic Microwave IC", Solid State Technology, Apr. 1985, pp. 62–69.

*Primary Examiner*—Stephen D. Meier
*Attorney, Agent, or Firm*—Leydig, Voit & Mayer

[57] ABSTRACT

A semiconductor device includes a semiconductor substrate having opposite front and rear surfaces; lower electrodes disposed on the front surface of the substrate and a rear electrode disposed on the rear surface of the substrate; an air-bridge wiring disposed on the front surface of the substrate and connecting two of the lower electrodes; a via-hole penetrating through the semiconductor substrate in the vicinity of the two selected lower electrodes; and via-hole wiring disposed in the via-hole and connecting the selected lower electrodes to the rear electrode, the air-bridge wiring and the via-hole wiring being a continuous, unitary electroplated metal film. The air-bridge wiring and the via-hole wiring are directly connected without any intermediate wiring so that a junction of these wirings has no contact resistance. Further, since these wirings are continuous in the electroplated metal film, mechanical strength and reliability are improved.

5 Claims, 32 Drawing Sheets

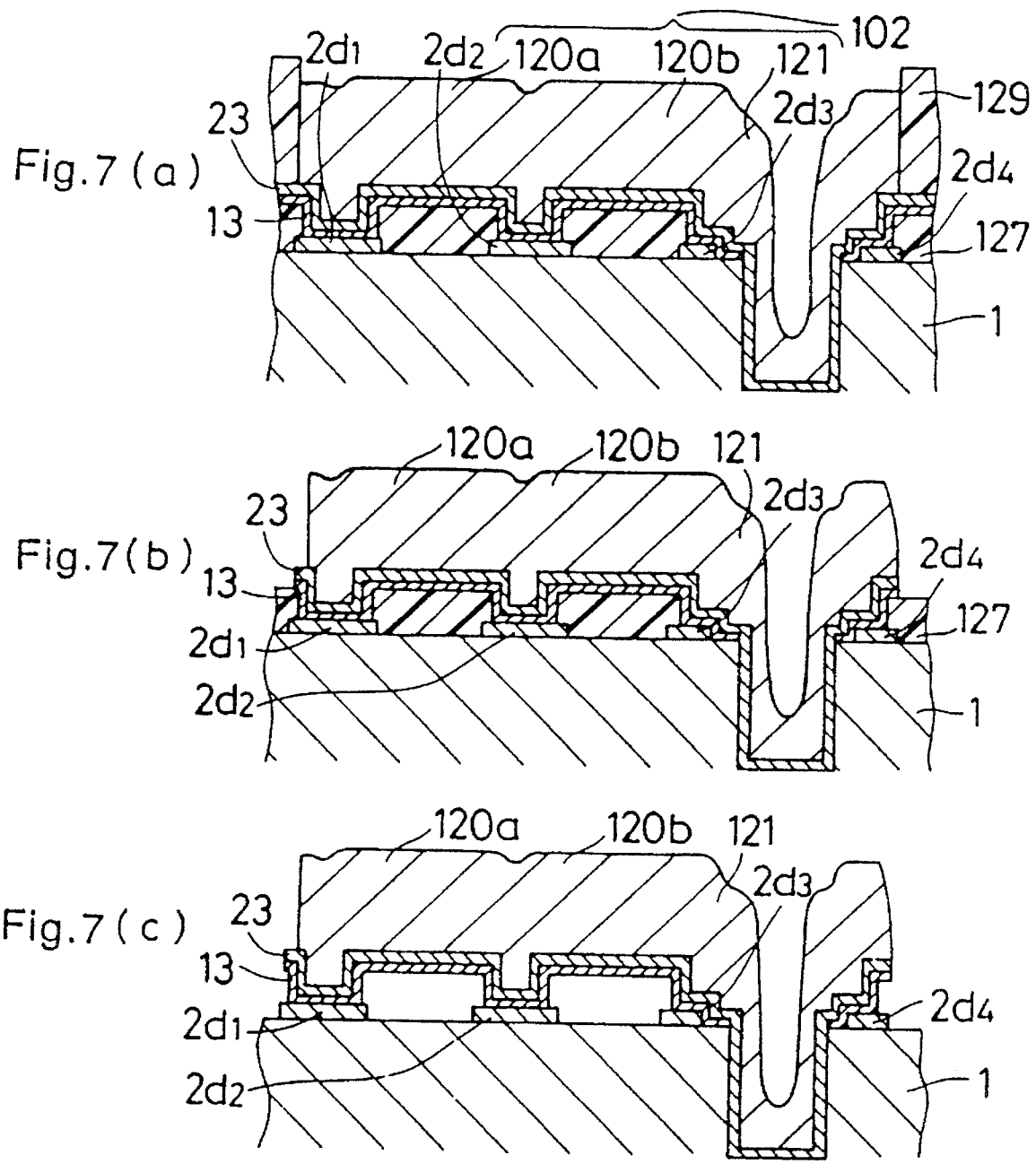

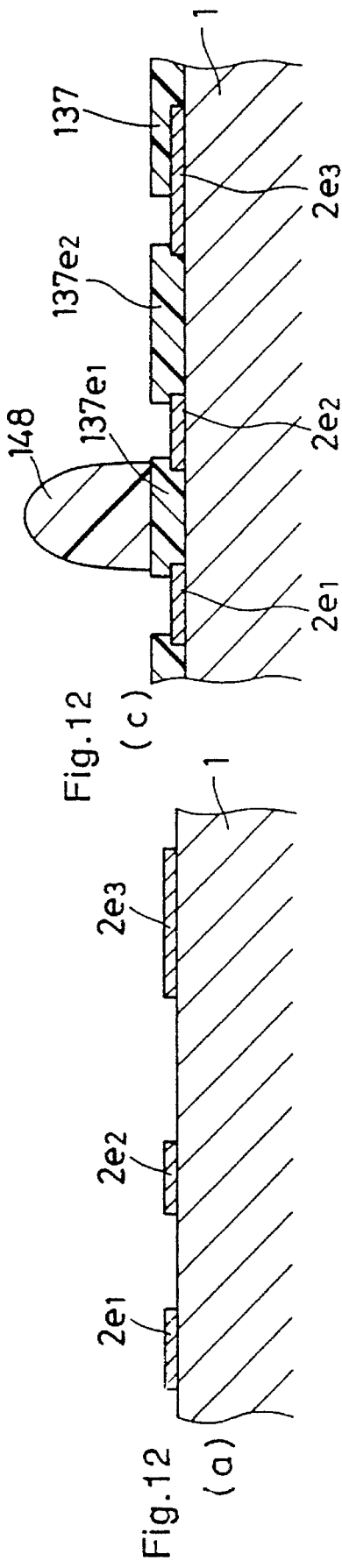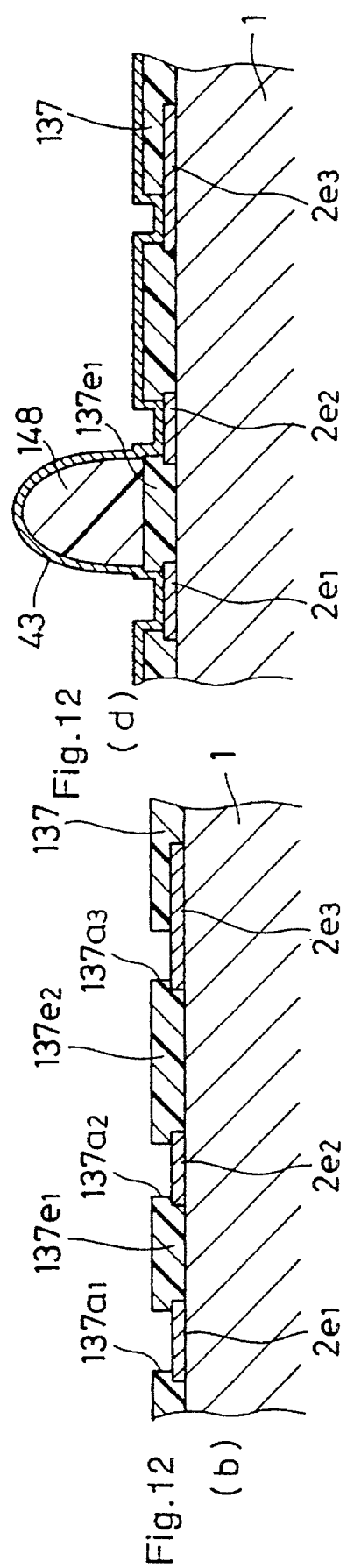
Fig. 12 (a)
Fig. 12 (b)
Fig. 12 (c)
Fig. 12 (d)

5,488,253

1

SEMICONDUCTOR DEVICE

FIELD OF THE INVENTION

The present invention relates to a semiconductor device and a method of producing the semiconductor device. More particularly, the invention relates to a structure for connecting electroplated air-bridge wiring to electroplated via-hole wiring, a structure for connecting electroplated air-bridge wiring to fine wiring electroplated on surface of a substrate, and a structure for connecting these electroplated wirings.

BACKGROUND OF THE INVENTION

FIG. 14 is a perspective view schematically illustrating a prior art GaAs monolithic microwave integrated circuit (hereinafter referred to as a GaAs MMIC). In FIG. 14, the GaAs MMIC includes a semi-insulating GaAs substrate 1 having opposite front and rear surfaces. There are disposed on the front surface of the substrate 1, first and second FETs 21 and 22, first and second MIM (Metal Insulator Metal) capacitors 31 and 32, a diffused resistor 40, first and second signal lines 51a and 51b, and first and second open stubs 52a and 52b for impedance matching. A rear electrode 12 is disposed on the rear surface of the substrate 1. The microwave circuit comprises the above-described active elements, passive elements, and signal lines. The semi-insulating semiconductor substrate 1 may comprise other III–V compound semiconductors, such as InP.

A drain region 1b common to the first and second FETs 21 and 22 is formed in a prescribed region of the GaAs substrate 1, and source regions $1a_1$ and $1a_2$ of the first and second FETs 21 and 22, respectively, are formed at opposite sides of the common drain region 1b. A drain electrode 2b common to the first and second FETs 21 and 22 is disposed on the common drain region 1b, and source electrodes $2a_1$ and $2a_2$ are disposed on the source regions $1a_1$ and $1a_2$, respectively. Gate electrodes $2c_1$ and $2c_2$ of the FETs 21 and 22 are disposed between the common drain region 1b and the source regions $1a_1$ and $1a_2$, respectively.

The MIM capacitor 31 (32) comprises a lower electrode 31a (32a), and an upper electrode 31c (32c) having an air-bridge structure disposed on the lower electrode 31a (32a) via an insulating film 31b (32b).

The source electrodes $2a_1$ and $2a_2$ of the first and second FETs 21 and 22 are connected to each other by an electroplated wiring 210 having an air bridge structure (hereinafter referred to as an air-bridge wiring). Further, the source electrodes $2a_1$ and $2a_2$ are connected to the rear electrode 12 through via-holes 211a and 212a in which plated wirings 211 and 212 are formed (hereinafter referred to as via-hole wirings).

FIG. 15(a) is a sectional view of a part of the GaAs MMIC 200 in the vicinity of the air-bridge wiring 210 and the via-hole wiring 212. In the figure, the same reference numerals as in FIG. 14 designate the same or corresponding parts. Reference numeral 3a designates a metal film serving as a feeding layer when the air-bridge wiring 210 is formed by electroplating. Reference numeral 3b designates a metal film serving as a feeding layer when the via-hole wiring 212 is formed by electroplating.

In a GaAs MMIC having the above-described structure, improved performance and reduced size are demanded in a key device of, for example, a portable telephone that has been spread in recent years. In order to meet these demands, it is necessary to increase the height of the air-bridge wiring

2 and reduce the size of the air-bridge wiring and the via-hole wiring for high density integration.

For example, when the height of the air-bridge wiring is increased, the capacitance between the air-bridge wiring and a lower wiring that crosses the air-bridge wiring is reduced, increasing the operation speed. When a portion of the air-bridge wiring contacting a lower electrode included in the lower wiring, i.e., a metal post, is reduced in size, the space between adjacent lower wirings is reduced, whereby the length of the wirings is reduced. Consequently, the operation speed of the microwave circuit is increased.

However, it is impossible to form a resist film having a fine pattern of an air-bridge wiring on a substrate having a via-hole or the like that causes a high step.

That is, as illustrated in FIG. 16(a), when the via-hole 212a is formed on the surface of the GaAs substrate 1 where the lower electrodes $2a_1$ and $2a_2$ are present, a considerable step is produced due to the via-hole 212a. In this case, if a thick resist film 17a is deposited on the surface of the substrate 1 as shown in FIG. 16(b) to avoid imperfect coverage by the resist film, it is difficult to produce minute resist apertures at portions $17a_1$ and $17a_2$ corresponding to metal posts of the air-bridge wiring. On the other hand, when a resist film 17b having a thickness that ensures improved, i.e., minute, resist apertures $17b_1$ and $17b_2$ at portions corresponding to the metal posts as shown in FIG. 16(c), the coverage of the resist film 17b is insufficient at the periphery of the via-hole 212a (regions "C" in FIG. 16(c)).

Therefore, in the prior art production method of an MMIC including air-bridge wirings and via-hole wirings, after electroplating of an air-bridge wiring on the substrate, a via-hole that causes a considerable step of the substrate is formed. Thereafter, a wiring layer is electroplated in the via-hole. In addition, for the patterning of the air-bridge wiring, a positive type resist that ensures a large aspect ratio of the resist aperture and that can be minutely patterned is employed. Further, for the patterning of the via-hole, a negative type resist that can be easily removed from the via-hole after the deposition of the resist is employed although it does not ensure an aspect ratio of the resist aperture as large as that of the positive type resist.

Hereinafter, the production method of the prior art GaAs MMIC will be described in more detail, emphasizing process steps of forming the air-bridge wiring and the via-hole wiring of the MMIC.

FIGS. 17(a)–17(f) are sectional views illustrating process steps of forming the air-bridge wiring, FIGS. 18(a)–18(b) are sectional views illustrating process steps of forming the via-hole wiring, and FIGS. 19(a)–19(d) are sectional views illustrating process steps of removing a resist film for selective plating of the via-hole wiring, and process steps on the rear surface of the substrate. In these figures, the same reference numerals as in FIGS. 14 and 15(a) designate the same or corresponding parts.

Initially, as illustrated in FIG. 17(a), active elements, such as FETs, passive elements, such as capacitors and resistors, and signal lines connecting these elements are formed on a semi-insulating GaAs substrate 1. On the front surface of the substrate 1, lower electrodes $2a_1$ and $2a_2$, such as source electrodes of FETs, and other lower electrodes 2 are present. Each of the lower electrodes is 1 μm~2 μm thick and comprises a single Au film or a laminated structure of Ti/Au, Ti/Mo/Au, or Ti/Pt/Au. The Ti layer in the laminated structure ensures a sufficient adhesion between the Au layer in the laminated structure and the lower electrode. In addition, the Mo and Pt layers in the laminated structures of Ti/Mo/Au and Ti/Pt/Au serve as barrier layers that prevent constituent elements of electrodes (not shown) comprising a reactive material and disposed under the lower electrodes from diffusing into an electroplated metal layer to be formed on the lower electrodes. In the lower electrode including an Au layer, the thickness of the uppermost Au layer accounts for 80–90 percent of the whole thickness of the lower electrode. In the lower electrode including a Ti layer or an Mo layer, the thickness of the Ti or Mo layer accounts for about 10 percent of the whole thickness of the lower electrode.

Thereafter, a positive type lower resist film 7 is deposited over the entire surface of the substrate to a thickness equivalent to a prescribed height of an air bridge wiring, for example, 1 μm or 3 μm. The lower resist film 7 is patterned to form apertures $7a_1$ and $7a_2$ at the lower electrodes $2a_1$ and $2a_2$, respectively (FIG. 17(b)).

In the step of FIG. 17(c), a feeding layer 3a that is used in a subsequent electroplating process is formed on the resist film 7 and in the apertures $7a_1$ and $7a_2$ of the resist film 7 to a thickness of 1000–2000 Å by sputtering or vapor deposition. The feeding layer 3a has a laminated structure, such as Ti/Mo/Au, and the uppermost Au layer accounts for a great part of the laminated structure.

In the step of FIG. 17(d), a positive type upper resist film 9 is deposited on the entire surface of the substrate and patterned to form an aperture 9a at a region of the substrate where an air-bridge wiring is to be formed, i.e., a region between the resist apertures $7a_1$ and $7a_2$. This upper resist film 9 serves as a mask in the subsequent electroplating process.

In the step of FIG. 17(e), using the upper resist film 9 as a mask, a metal film is selectively electroplated in the resist aperture 9a to a thickness of 1 μm–10 μm, forming an air-bridge wiring 210 connecting the lower electrodes $2a_1$ and $2a_2$. The reason why a positive type resist is employed as the upper resist 9 is that the positive type resist provides good verticality of the side walls of the resist aperture.

Thereafter, using the air-bridge wiring as a mask, the upper resist film 9 is removed with a release solution or ashing (FIG. 17(f)), and the feeding layer 3a is removed by ion milling. Finally, the lower resist film 7 including a portion under the air-bridge wiring 210 is completely removed with a release solution, resulting in a structure shown in FIG. 18(a).

In the step of FIG. 18(b), a positive type resist film 8 is deposited under predetermined conditions, such as the rotation frequency of spin coating, the viscosity of the resist, and the temperature of the applied resist, so that the resist enters the space under the air-bridge wiring 210. Subsequently, the resist film 8 is patterned to form an aperture 8a at a region where a via-hole is to be formed.

Using the resist film 8 as a mask, a via-hole 212a is formed by RIE (Reactive Ion Etching), followed by removal of the resist film 8 with a release solution (FIG. 18(c)).

Thereafter, a negative type lower resist film 10 is deposited to a thickness sufficient to completely cover the air-bridge wiring 210. The lower resist film 10 is patterned to form an aperture 10a opposite the via-hole 212a and the vicinity (FIG. 18(d)). The reason why a negative type resist is used as the lower resist film 10 is that the negative type resist deposited in the via-hole 212a can be completely removed when the resist film is patterned.

In the step of FIG. 18(e), a feeding layer 3b used in a subsequent electroplating process is formed by sputtering. Thereafter, as illustrated in FIG. 18(f), a negative type upper resist film 11 is deposited over the entire surface and patterned to form an aperture 11a on the via-hole 212a. The resist aperture 11a is larger than the resist aperture 10a of the lower resist 10. Using the upper resist film 11 as a mask, a metal film is selectively electroplated in the resist aperture 11a to a thickness of 5 μm to 8 μm, forming a via-hole wiring 212 (FIG. 18(f)).

After removal of the upper resist film 11 with a release solution (FIG. 19(a)), the feeding layer 3b is removed by ion milling, and the lower resist 10 is removed with a release solution (FIG. 19(b)). In this way, the processing on the front surface of the GaAs substrate 1 is completed.

Thereafter, the rear surface of the substrate 1 is etched until the bottom surface of the via-hole wiring 212 is exposed (FIG. 19(c)). Finally, a rear electrode 12 is formed on the rear surface of the substrate 1 to complete the GaAs MMIC 200 shown in FIG. 19(d).

The above-described prior art method illustrated in FIGS. 17(a)–17(f), 18(a)–18(f), and 19(a)–19(d) in which the air-bridge wiring and the via-hole wiring are formed in the different electroplating steps has the following drawbacks.

That is, after the formation of the air-bridge wiring 210 (FIG. 18(c)), the unevenness of the surface of the substrate 1 is considerable. Therefore, in the step of FIGS. 18(d)–18(f), it is difficult to form fine patterns of the lower and upper resist films 10 and 11 which serve as masks for the subsequent selective electroplating of the via-hole wiring 212, with good coverage. Although the coverage can be improved by increasing the thicknesses of the resist films 10 and 11, in this case the resist apertures 10a and 11a have unwanted over-hanging portions or portions of the resist films remain at the bottom of the via-hole 212a. On the other hand, when the resist films 10 and 11 are thin enough to produce fine patterns of the apertures 10a and 11a, the coverage of the resist films is poor at the upper edge of the air-bridge wiring 210.

The poor coverage of the resist films 10 and 11 causes excessive plating of the metal film 212 at the upper edge of the air-bridge wiring 210. Further, when the resist films 10 and 11 remain in the via-hole 212a because of inferior patterning of the resist films, the metal film 212 is plated abnormally in the via-hole 212a.

The above-described troubles in the production process adversely affect the characteristics of the device. For example, the excessive growth of the plated metal causes an increase in the capacitance or a short-circuiting between adjacent plated wirings, and the abnormal growth of the plated metal reduces the reliability of the metal wiring.

Furthermore, in the second electroplating process of the metal wiring 212, it is difficult to connect the metal wiring 212 to the metal wiring 210 formed in the first electroplating process because the adhesion between the plated metals is not sufficient. Therefore, the plated wirings 210 and 2212 are connected through the lower electrode $2a_2$ alone as shown in FIG. 15(a). Consequently, the wiring resistance cannot be adequately reduced.

Furthermore, in the structure shown in FIG. 15(b), since a portion $2a_{21}$ of the lower electrode $2a_2$ under the air-bridge wiring is separated from a portion $2a_{22}$ of the lower electrode under the via-hole wiring 212, these portions must be connected by an additional lower wiring $2a_3$. In this case, in addition to the wiring resistance of the lower wiring $2a_3$, contact resistances are produced at the junctions of the lower wiring $2a_3$ and the portions $2a_{21}$ and $2a_{22}$ of the lower electrode $2a_2$. Consequently, a device with sufficient performance cannot be obtained.

Further, since the air-bridge wiring 210 and the via-hole wiring 212 have different heights on the substrate 1 as shown in FIG. 15(a), when the substrate 1 is etched from the rear surface with the front surface adhered to a support plate (not shown), the holding power is not evenly distributed across the substrate, resulting in cracking or tilting of the substrate. When the substrate tilts, it is difficult to accurately control the thickness of the substrate during the rear etching process.

A description is given of another structure for connecting electroplated wirings, employed in a prior art GaAs MMIC or the like.

FIG. 20 is a sectional view for explaining a structure for connecting a plated air-bridge wiring and an ordinary plated wiring, i.e., a wiring having no air-bridge structure, employed in a prior art GaAs MMIC.

In FIG. 20, reference numeral 1 designates a semi-insulating GaAs substrate having opposite front and rear surfaces. A first lower electrode $2b_1$ having a relatively small width and a second lower electrode $2b_2$ having a relatively large width are disposed on the front surface of the GaAs substrate 1. The first lower electrode $2b_1$ is connected to the second lower electrode $2b_2$ through a plated air-bridge wiring 220. Reference numeral 221 designates an ordinary plated metal wiring, such as a signal line. A portion of the plated wiring 221 is disposed on an end of the second lower wiring $2b_2$ as a bonding pad. Preferably, the first and second lower electrodes $2b_1$ and $2b_2$ comprise a single Au layer or a laminated structure of Ti/Au, Ti/Mo/Au, or Ti/Pt/Au.

When used in the GaAs MMIC shown in FIG. 14, the structure shown in FIG. 20 is applicable to a connection between the air-bridge upper electrode 32c of the MIM capacitor 32 and the signal line 51b. Although the air-bridge upper electrode 32c is united with the signal line 51b in FIG. 14, in an actual device the electroplated portion of the air-bridge upper electrode 220 is not connected to the signal line 221. Only the lower electrode $2b_2$ is connected to the signal line 221.

The method of producing the prior art GaAs MMIC including the air-bridge wiring 220 and the ordinary metal wiring 221 will be described briefly.

Initially, as illustrated in FIG. 21(a), the lower electrodes $2b_1$ and $2b_2$ are formed on prescribed regions of the semi-insulating GaAs substrate 1.

In the step of FIG. 21(b), a lower resist film 27 is deposited over the entire surface and patterned by exposure and development techniques to form resist apertures $27a_1$ and $27a_2$ opposite portions of the lower electrodes $2b_1$ and $2b_2$ for contact with an air-bridge wiring, and a resist aperture $27a_3$ opposite a portion of the lower electrode $2b_2$ on which a bonding pad is to be disposed.

Thereafter, as illustrated in FIG. 21(c), a feeding layer 3 for a subsequent electroplating process is deposited to a thickness of 1000–2000 Å by sputtering or vapor deposition. Preferably, the feeding layer 3 comprises Ti/Mo/Au.

In the step of FIG. 21(d), a negative type upper resist film 28 is deposited to a thickness equivalent to a prescribed height of an air-bridge wiring. The resist film 28 is patterned to form a resist aperture 28a opposite a region including the lower resist apertures $27a_1$ and $27a_2$, and a resist aperture 28b opposite a region including the lower resist aperture $27a_3$. The upper resist aperture 28b is larger than the lower resist aperture $27a_3$.

Using the upper resist film 28 as a mask, a metal film is selectively electroplated in the resist apertures 28a and 28b to a thickness of 1 μm~10 μm, forming an air-bridge wiring 220 connecting the lower electrodes $2b_1$ and $2b_2$, and an ordinary wiring 221 having a portion connected to the lower electrode $2b_2$ as a bonding pad (FIG. 22(a)).

Thereafter, the upper resist film 28 is removed by ashing or a release solution (FIG. 22(b)), and the feeding layer 3 is removed by ion milling using the plated wirings 220 and 221 as masks (FIG. 22(c)).

After removal of the lower resist film 27 with a release solution, the rear surface of the substrate 1 is etched and a rear electrode 12 is formed over the rear surface of the substrate 1, completing a GaAs MMIC (FIG. 22(d)).

The above-described prior art method illustrated in FIGS. 21(a)–21(d) and 22(a)–22(d) in which the air-bridge metal wiring 220 and the ordinary metal wiring 221 are formed simultaneously in the same electroplating process has the following drawbacks.

In this prior art method, the lower resist film 27 serves both as a mask for patterning the air-bridge wiring 220 and a mask for patterning the metal wiring 221. Since the thickness of the lower resist film 27 is equivalent to the height of the air-bridge wiring, it exceeds a sufficient thickness of a mask for patterning of the metal wiring 221. In this case, it is very difficult to form a fine pattern of the metal wiring 221 by selective electroplating.

Further, in the region where the metal wiring 221 is formed, since the aperture 28a of the upper resist film 28 is larger than the aperture 27a of the lower resist film 27, the plated metal wiring 221 has a swollen portion 221a at its periphery as shown in FIG. 20. The swollen portion 221a of the plated metal wiring 221 causes considerable unevenness of the surface of the substrate, adversely affecting subsequent processing and assembly. For example, the swollen portion 221a of the metal wiring 221 vibrates and cracks in a vibration test. In addition, the swollen portion 221a is an obstacle when a wire is bonded to the bonding pad of the plated metal wiring 221.

Meanwhile, Japanese Published Patent Application No. Sho. 63-296247 discloses a method of producing metal wirings, in which a fine and thin wiring is produced and a sufficient height of an air-bridge wiring is maintained. In this method, the fine wiring having a prescribed thickness and a lower part of the air-bridge wiring are formed simultaneously in a first electroplating process. Thereafter, in a second electroplating process, a metal layer is selectively plated on the lower part of the air-bridge wiring to form an upper part of the air-bridge wiring, completing the air-bridge wiring. In this method, however, it is impossible to produce a fine and thin wiring and an adequately high air-bridge wiring in only one electroplating step.

SUMMARY OF THE INVENTION

It is an object of the present invention to provide a semiconductor device including a plated air-bridge wiring and a plated via-hole wiring, in which a junction of the air-bridge wiring and the via-hole wiring has a high mechanical strength and in which a reduced resistance, and these wirings have the same height on the substrate.

It is another object of the present invention to provide a method of producing a semiconductor device including a plated air-bridge wiring and a plated via-hole wiring, in which the air-bridge wiring and the via-hole wiring are formed in a layer in an electroplating process, and fine patterns of the air-bridge wiring and the via-hole wiring are produced while increasing the height of the air-bridge wiring.

It is still another object of the present invention to provide a semiconductor device including a plated air-bridge wiring and a plated wiring having no air-bridge structure, in which a junction of the air-bridge wiring and the plated wiring has a high mechanical strength and a reduced resistance.

It is a further object of the present invention to provide a method of producing a semiconductor device in which a fine wiring connected to an air-bridge wiring is formed while maintaining a sufficient height of the air-bridge wiring, and a plurality of air-bridge wirings having different heights are easily produced.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device includes a semiconductor substrate having opposite front and rear surfaces, a plurality of lower electrodes disposed on the front surface, and a rear electrode disposed on the rear surface, an air-bridge wiring disposed on the front surface of the substrate and electrically connecting selected lower electrodes selected from the lower electrodes disposed on the front surface of the substrate, a via-hole penetrating through the semiconductor substrate at a position in the vicinity of the air-bridge wiring, a via-hole wiring disposed in the via-hole and connecting the selected lower electrodes to the rear electrode, wherein the air-bridge wiring and the via-hole wiring are united with each other in an electroplated metal film. Therefore, the air-bridge wiring and the via-hole wiring are connected with no intermediate wiring, so that a junction of these wirings has no contact resistance. Further, since these wirings and the junction are continuous in the electroplated metal film, the mechanical strength and the reliability of the junction are improved.

According to a second aspect of the present invention, in the above-described semiconductor device, the height of the electro-plated metal film at the periphery of the opening of the via-hole is approximately equal to the height at the air-bridge wiring. Therefore, when the rear surface of the semiconductor substrate is etched with the front surface adhered to a support plate, unwanted breaking and cracking of the semiconductor substrate due to local concentration of stress applied to the substrate are avoided. Further, since unwanted tilting of the semiconductor substrate on the support plate is avoided, the thickness of the semiconductor substrate is accurately controlled in the rear etching process.

According to a third aspect of the present invention, in the above-described semiconductor device, a feeding layer is interposed between the electroplated metal film and the lower and rear electrodes connected to the metal film, and the feeding layer has a multilayer structure of different metals. Therefore, the feeding layer has a plurality of functions.

According to a fourth aspect of the present invention, in the above-described semiconductor device, the feeding layer includes a barrier metal layer comprising Mo, Pt, TiN, or the like that prevents reactive elements of the lower electrodes from diffusing into the electroplated metal film. Therefore, the characteristics of the electroplated metal wiring are not degraded. Furthermore, it is not necessary to insert a barrier metal layer between the substrate and the lower electrode or between the lower electrode and the feeding layer.

According to a fifth aspect of the present invention, in a method of producing a semiconductor device, after formation of a first resist film for patterning of an air-bridge wiring, a first feeding layer is formed over the entire surface, and the first feeding layer and the substrate are selectively etched using a second resist mask to form a via-hole. Thereafter, a second feeding layer is formed, and a metal film is electroplated using a third resist film having a prescribed pattern as a mask, thereby forming an air-bridge wiring and a via-hole wiring which are united with each other in the electroplated film. Therefore, the air-bridge wiring and the via-hole wiring are formed in an electroplating process, so that the production process is significantly simplified.

According to a sixth aspect of the present invention, in the above-described production method, as the first feeding layer, a metal film comprising a reactive material that can be dry-etched, such as Mo, TiN, or W, is employed. Therefore, the removal of the first feeding layer and the formation of the via-hole can be successively carried out in a reactive dry etching process, whereby the production process is significantly simplified. Furthermore, when the first and second feeding layers are removed using the electroplated metal film as a mask, the first feeding layer can be removed not by ion milling that physically ablates the feeding layer but by reactive dry etching, such as reactive ion etching, that chemically removes the feeding layer, so that loss of the electroplated metal film as an etching mask is avoided.

According to a seventh aspect of the present invention, in the above-described production method, the first resist film comprises polyimide resin that has high resistance to heat and stress. Therefore, the first resist film is not deformed very much due to stress applied from the feeding layer, whereby disconnection of the feeding layer due to deformation of the first resist film is avoided. Consequently, the air-bridge wiring is produced with high reliability and uniformity.

According to an eighth aspect of the present invention, in the above-described production method, the second feeding layer is formed by electroless plating. Therefore, the second feeding layer is formed with good coverage at the high step part of the substrate and a uniform thickness at the bottom of the via-hole.

According to a ninth aspect of the present invention, a semiconductor device includes a plated air-bridge wiring and an ordinary plated wiring having no air-bridge structure disposed in the vicinity of the air-bridge wiring. These wirings are united with each other in an electroplated metal film. Therefore, the air-bridge wiring and the ordinary wiring are connected with no intermediate wiring, so that a junction of these wirings has no contact resistance. Further, since these wirings and the junction are continuous in the electroplated metal film, the mechanical strength and the reliability of the junction part are improved.

According to a tenth aspect of the present invention, in a method of producing a semiconductor device, a first resist film is deposited on a front surface of a semiconductor substrate where first and second lower electrodes are disposed. The resist film is patterned to form a first spacer for electroplating between first and second lower electrodes disposed on the semiconductor substrate and a resist aperture on the second lower electrode. Thereafter, a second resist film is deposited over the entire surface and patterned to form a second spacer on the first spacer. Then, a metal film is selectively electroplated on the semiconductor substrate, whereby an air-bridge wiring connecting the first and second lower electrodes and an ordinary wiring connected to the second lower electrode are simultaneously formed by the electroplated metal film. Therefore, sufficiently thin and narrow ordinary wiring is formed regardless of the height of the air-bridge wiring while maintaining a sufficient height of the air-bridge wiring, whereby the area of the junction of the ordinary wiring and the lower electrode is reduced. Further, the height of the plated metal portion at the periphery of the ordinary wiring is significantly reduced to increase the resistance of the wiring to vibration or the like, whereby wire bonding to the ordinary wiring is facilitated.

According to an eleventh aspect of the present invention, in the above-described semiconductor device, the air-bridge wiring is arched. Therefore, the mechanical strength of the air-bridge wiring is increased.

According to a twelfth aspect of the present invention, in the above-described production method, the second spacer corresponding to a space under the air-bridge wiring is transformed in a thermal treatment so that the upper surface of the second spacer curves outwards. Therefore, the above-described arched air-bridge wiring is easily formed.

According to a thirteenth aspect of the present invention, in the above-described production method, the feeding layer is formed on the resist film for selective electroplating by vacuum deposition. Therefore, the resist film is not damaged very much by the vapor deposition of the feeding layer.

According to a fourteenth aspect of the present invention, in a method of producing a semiconductor device, a first resist film is deposited over a front surface of a semiconductor substrate where first to third lower electrodes are disposed. The resist film is patterned to form a first spacer for electroplating between the first and second lower electrodes and a second spacer for electroplating between the second and third lower electrodes. Thereafter, a second resist film is deposited and patterned to form a second spacer for electroplating on the first spacer. Then, a metal film is selectively electroplated, whereby a relatively high air-bridge wiring connecting the first and second lower electrodes and a relatively low air-bridge wiring connecting the second and third lower electrodes are simultaneously produced.

According to a fifteenth aspect of the present invention, in a method of producing a semiconductor device, when a plurality of air-bridge wirings are formed by electroplating, as spacers for producing spaces under the air-bridge wirings, three spacers having different heights are formed by patterning of first and second resist films having different thicknesses. Therefore, three air-bridge wirings having different heights are produced.

BRIEF DESCRIPTION OF THE DRAWINGS

FIGS. 6(a)–6(f) and 7(a)–7(e) are sectional views illustrating process steps in a method of producing the structure shown in FIG. 5.

FIGS. 12(a)–12(d) and 13(a)–13(e) are sectional views illustrating process steps in a method of producing the structure shown in FIG. 11.

DETAILED DESCRIPTION OF THE PREFERRED EMBODIMENTS

[Embodiment 1]

Figure 1:
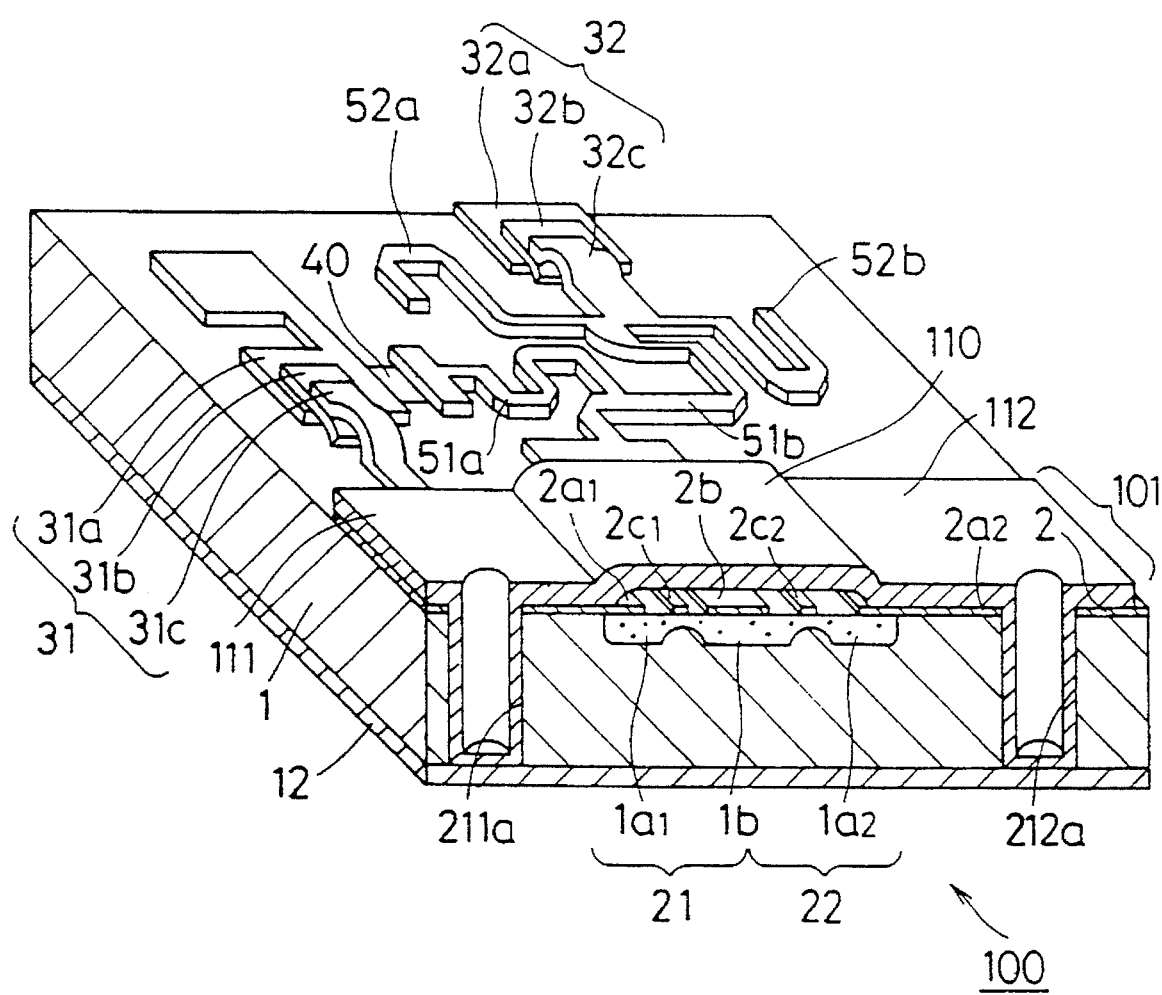
FIG. 1 is a perspective view, partly in section, illustrating a GaAs MMIC in accordance with a first embodiment of the present invention.
Figure 14:
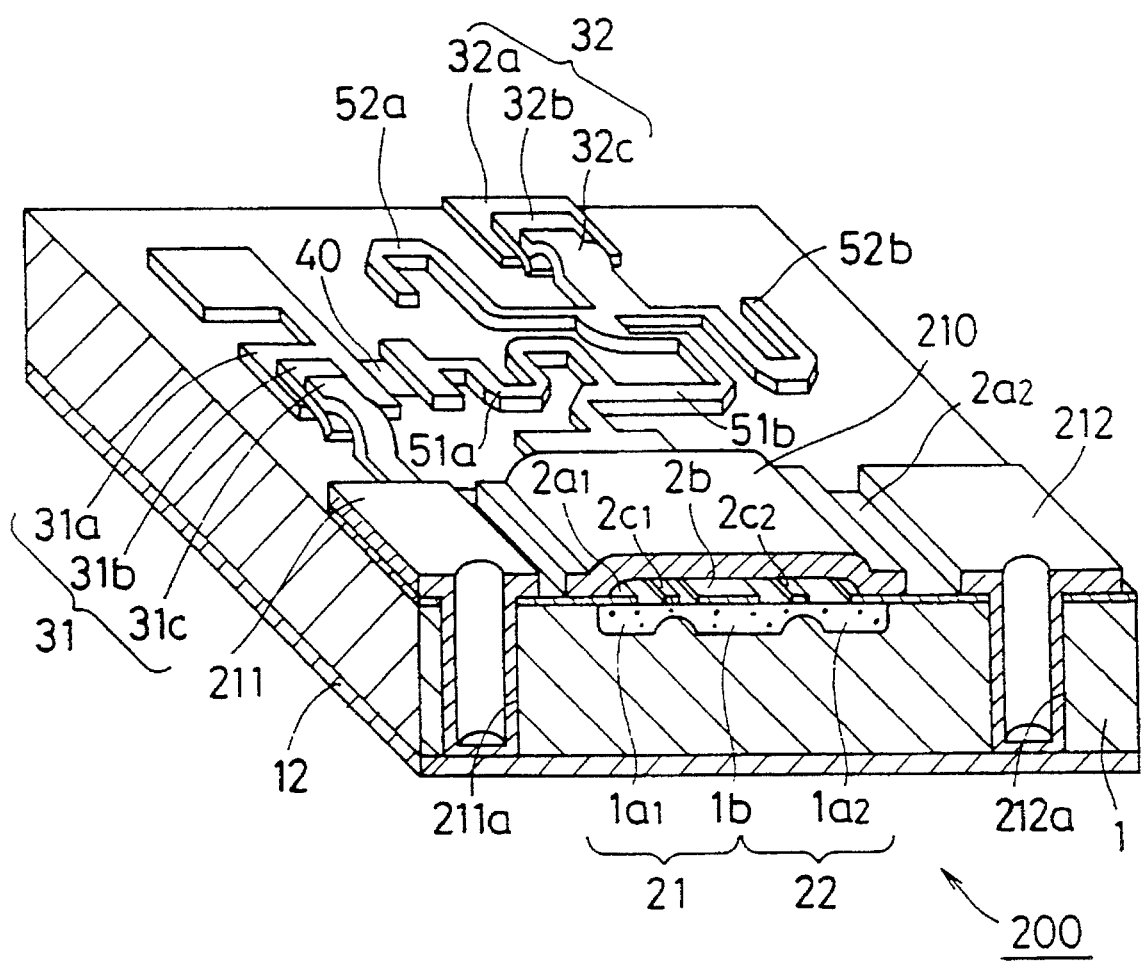
FIG. 14 is a perspective view, partly in section, illustrating a GaAs MMIC in accordance with the prior art.
Figure 15A:
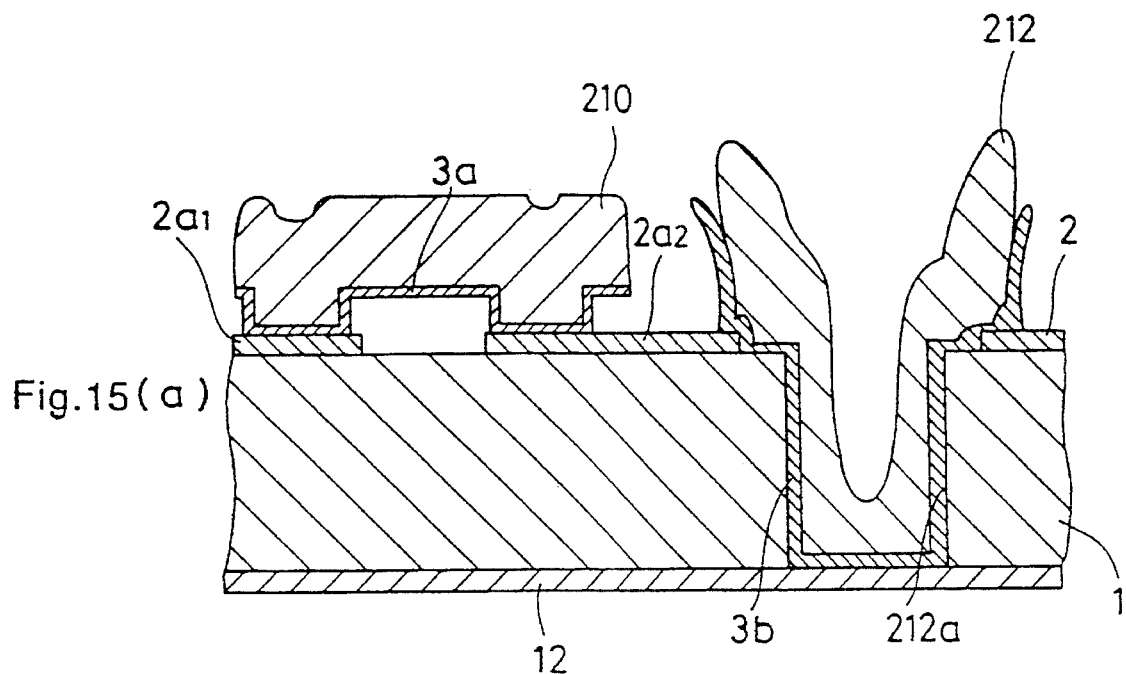
FIGS. 15(a) and 15(b) are sectional views illustrating air-bridge wiring and via-hole wiring connecting structures employed in a GaAs MMIC according to the prior art.
Figure 15B:
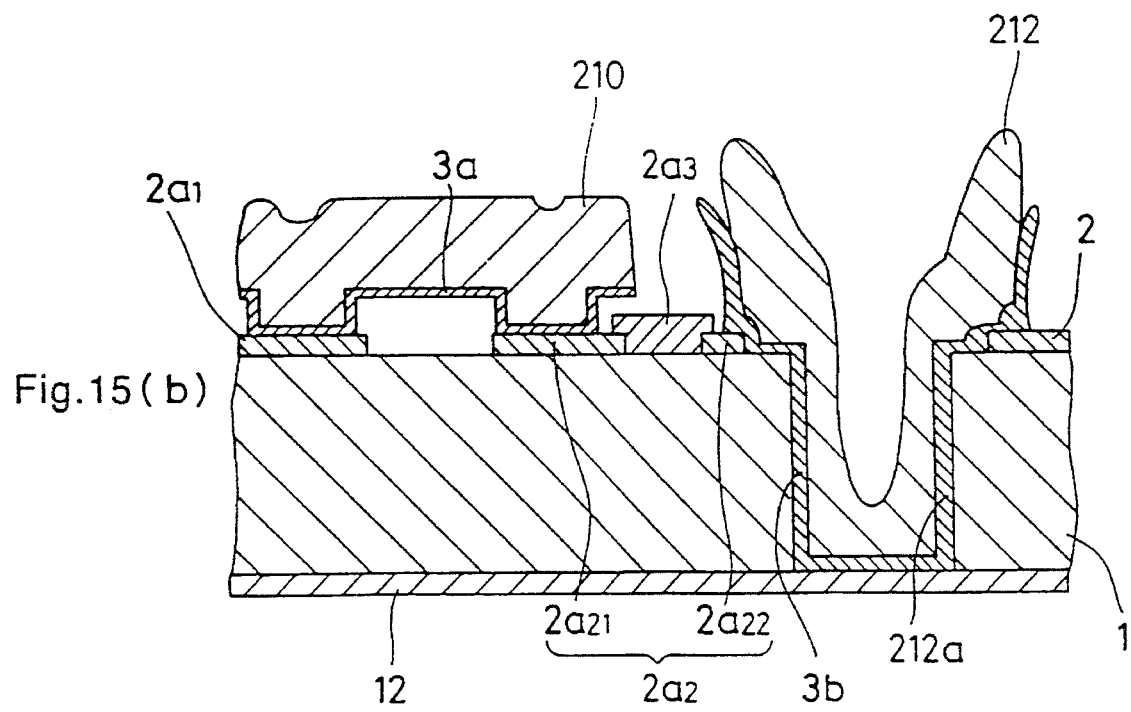
Figure 16A:
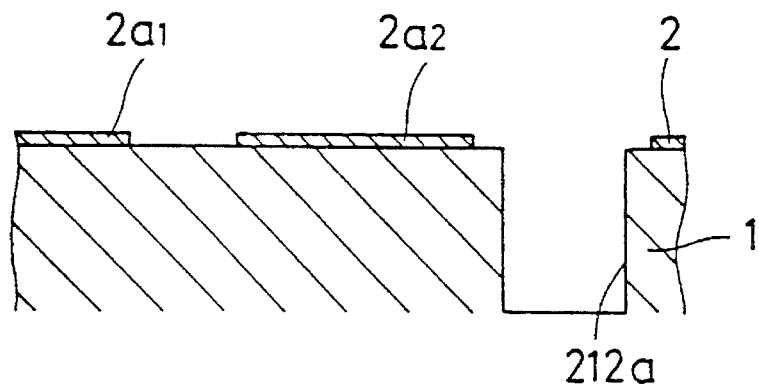
FIGS. 16(a)–16(c) are sectional views for explaining problems when a fine resist pattern is formed on a substrate having a high step, such as a via-hole.
Figure 16B:
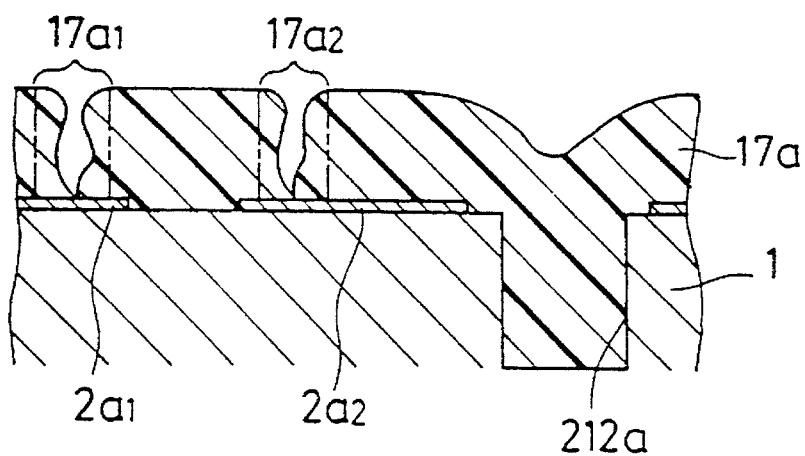
Figure 16C:
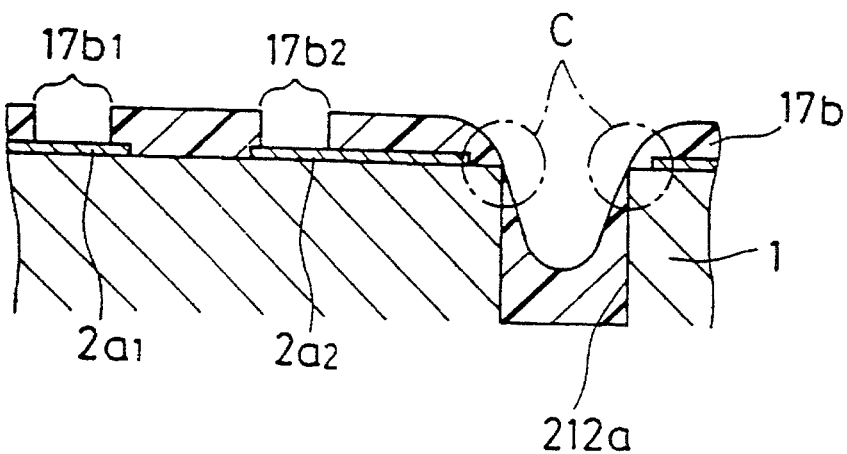

FIG. 1 is a perspective view, partly in section, illustrating a GaAs MMIC in accordance with a first embodiment of the present invention. In FIG. 1, a GaAs MMIC 100 includes an air-bridge wiring 110 and via-hole wirings 111 and 112. The air-bridge wiring 110 connects a source electrode $2a_1$ of a first FET 21 to a source electrode $2a_2$ of a second FET 22. The via-hole wirings 111 and 112 connect the source electrodes $2a_1$ and $2a_2$ to a rear electrode 12, respectively. The air-bridge wiring 110 and the via-hole wirings 111 and 112 are portions of an electroplated metal layer 101. The height of the plated metal layer 101 at the periphery of a via-hole 211a (212a) is the same as that at the top of the air-bridge wiring 110. Other constituents of the GaAs MMIC 100 are the same as those of the prior art GaAs MMIC 200 shown in FIG. 14.

Figure 2:
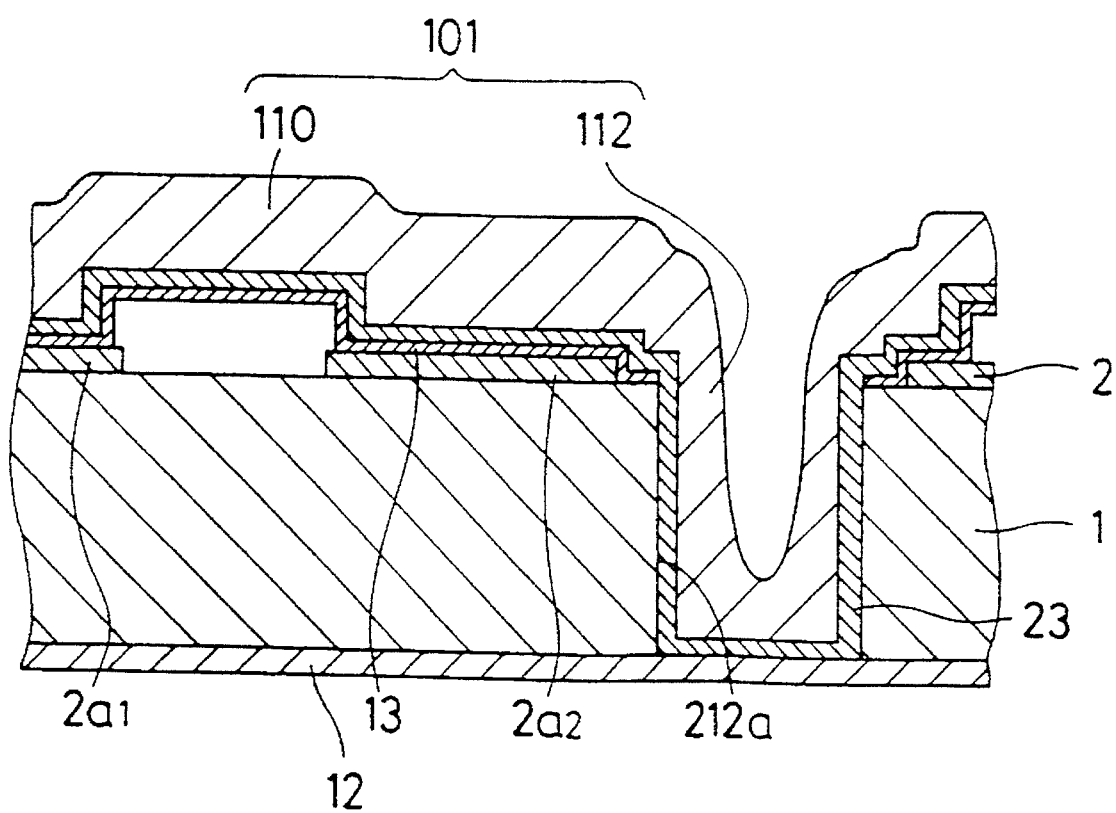
FIG. 2 is a sectional view of a part of the GaAs MMIC shown in FIG. 1, illustrating an air-bridge wiring and via-hole wiring connecting structure.

In this first embodiment of the invention, a lower feeding layer 13 and an upper feeding layer 23 are used for the electroplating of the metal wirings as shown in FIG. 2. FIG. 2 shows a connecting part of the air-bridge wiring 110 and the via-hole wiring 112 on the second FET 22 side.

A description is given of process steps in producing the air-bridge wiring and the via-hole wiring in a method of producing the GaAs MMIC shown in FIG. 1.

FIGS. 3(a)–3(f) are sectional views illustrating process steps in producing a lower resist film for selective plating, a via-hole, and a feeding layer. FIGS. 4(a)–4(f) are sectional views illustrating process steps of producing an air-bridge wiring and a via-hole wiring by electroplating.

Figure 3:
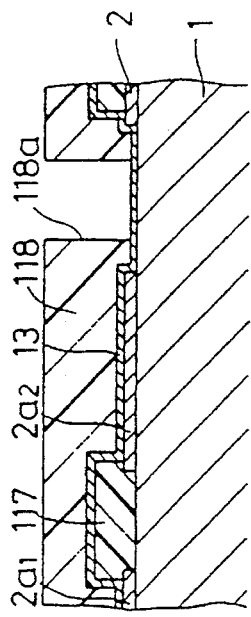
FIGS. 3(a)–3(f) and 4(a)–4(e) are sectional views illustrating process steps in a method of producing the structure shown in FIG. 2.
Figure 3:
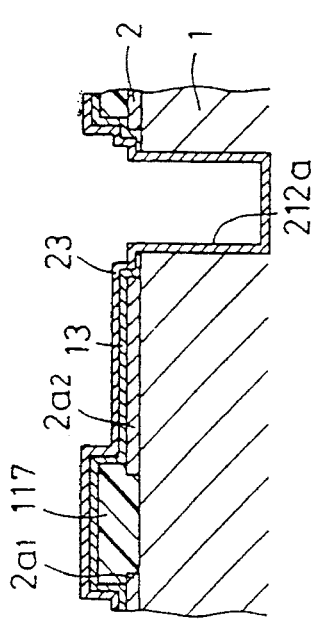
Figure 3:
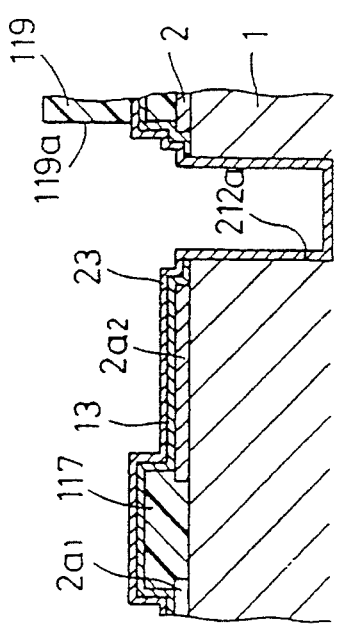
Figure 3:
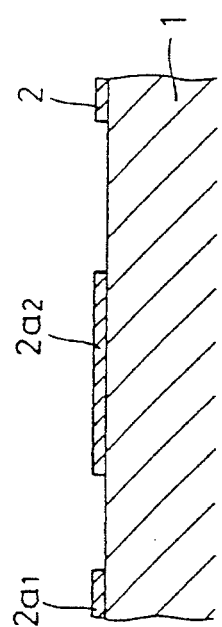
Figure 3:
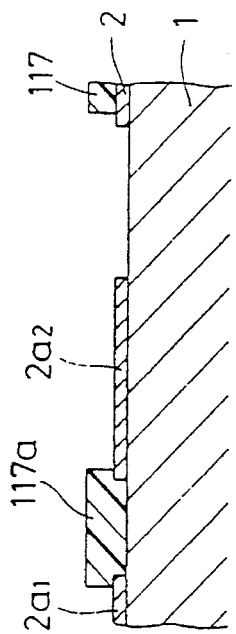
Figure 3:
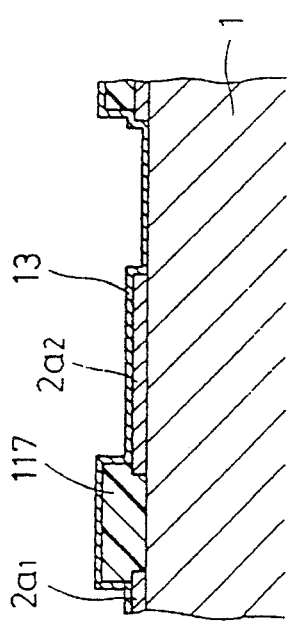
Figure 17A:
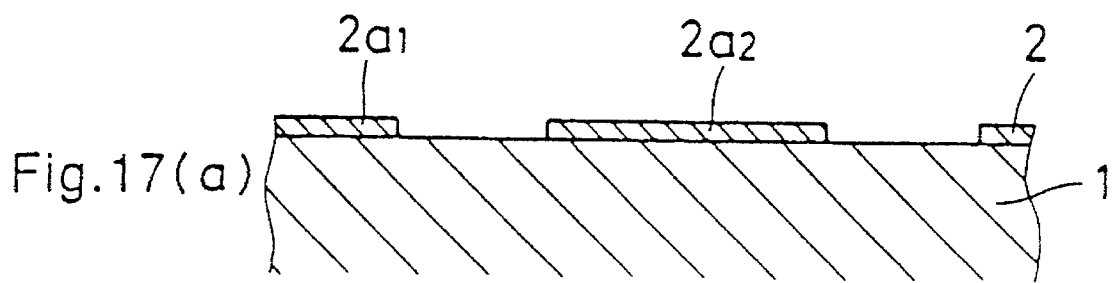
FIGS. 17(a)–17(f), 18(a)–18(f), and 19(a)–19(d) are sectional views illustrating process steps in a method of producing a GaAs MMIC according to the prior art.
Figure 17B:
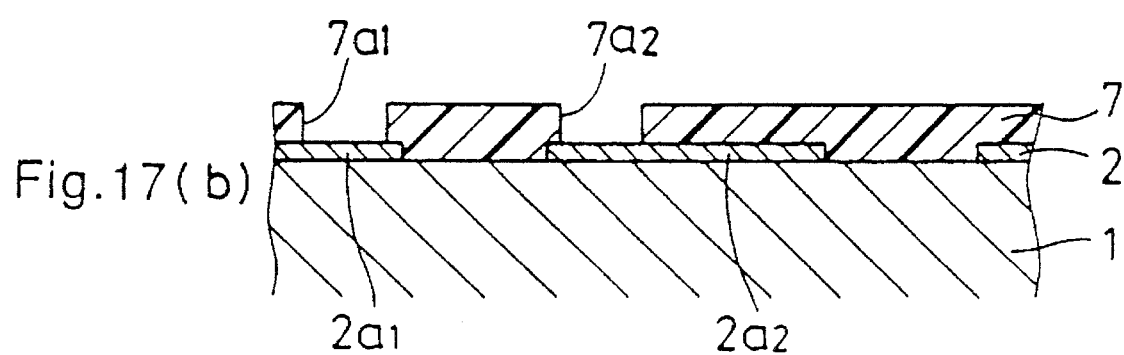
Figure 17C:
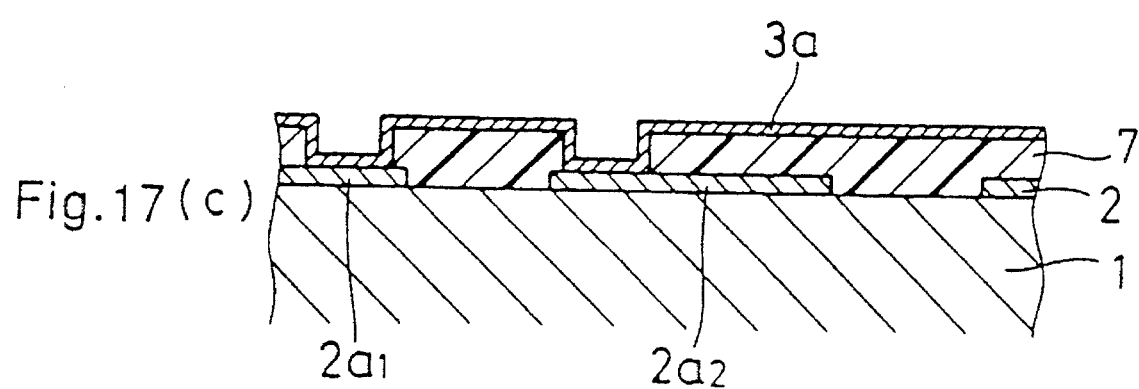
Figure 17D:
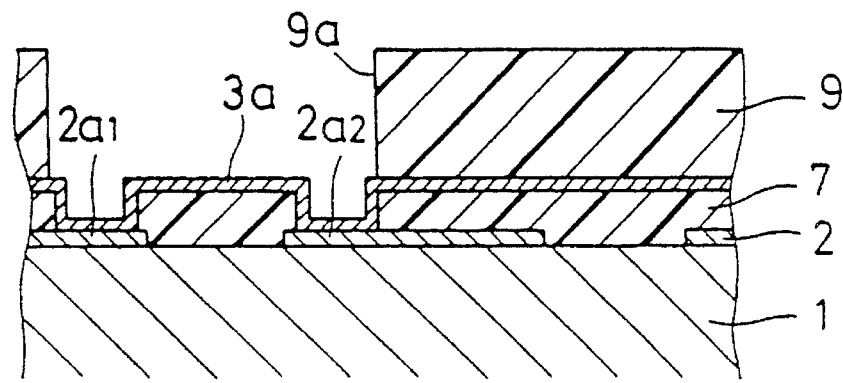
Figure 17E:
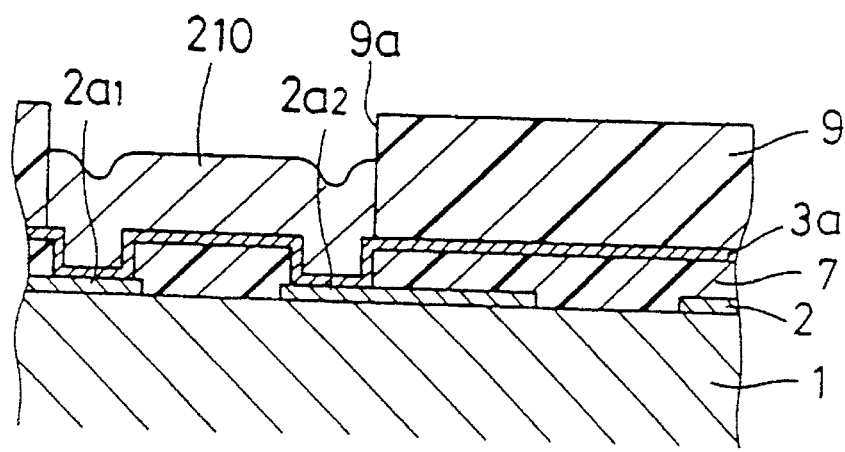
Figure 17F:
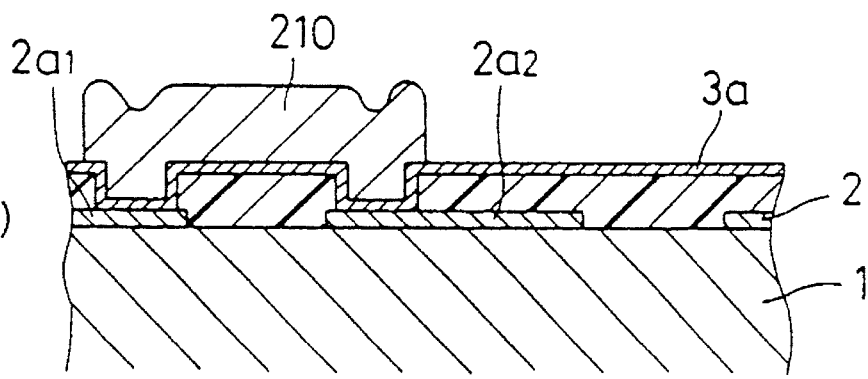
Figures 18A, 18B, 18C:
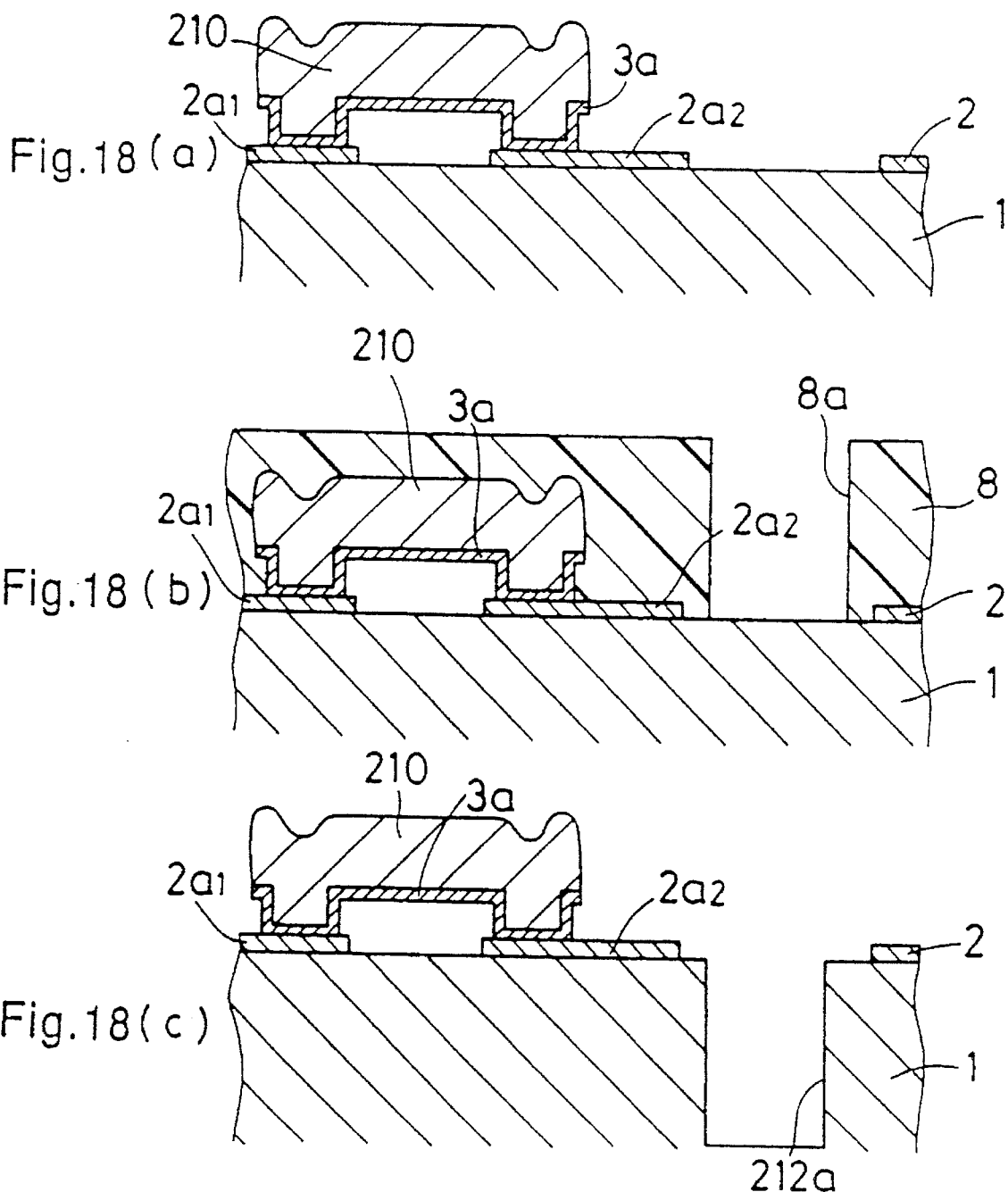
Figure 18D:
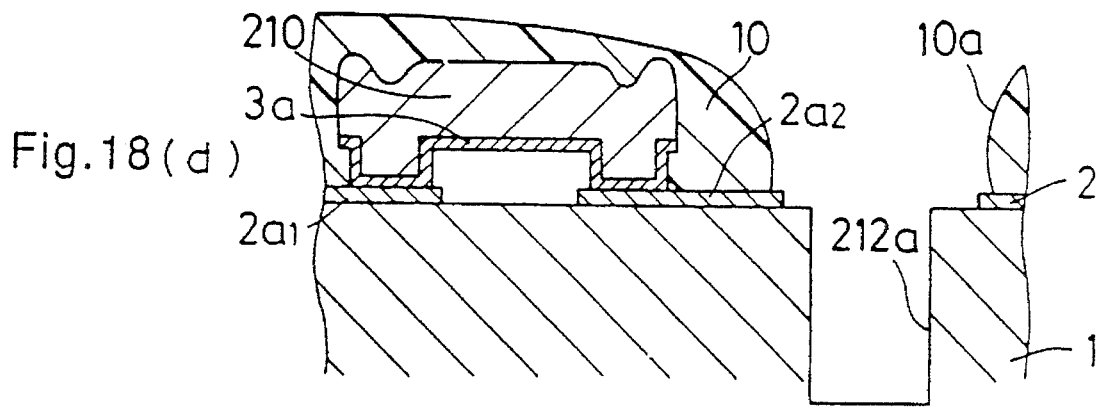
Figure 18E:
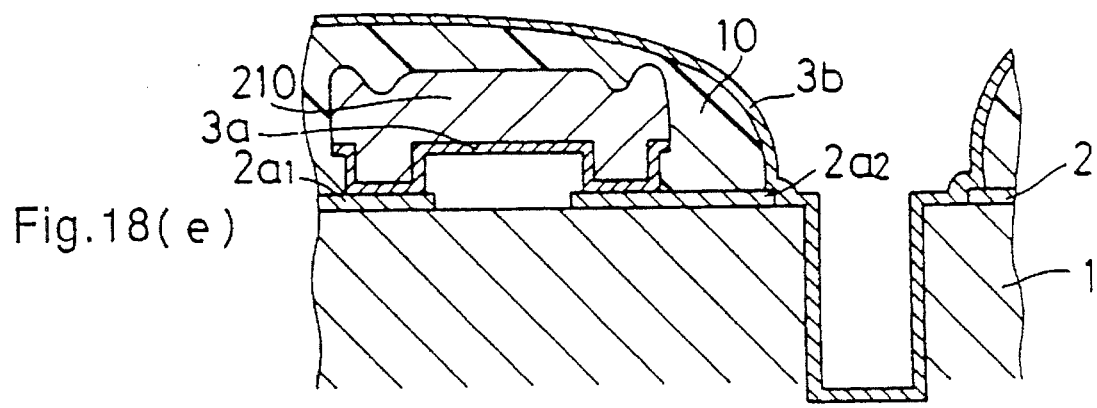
Figure 18F:
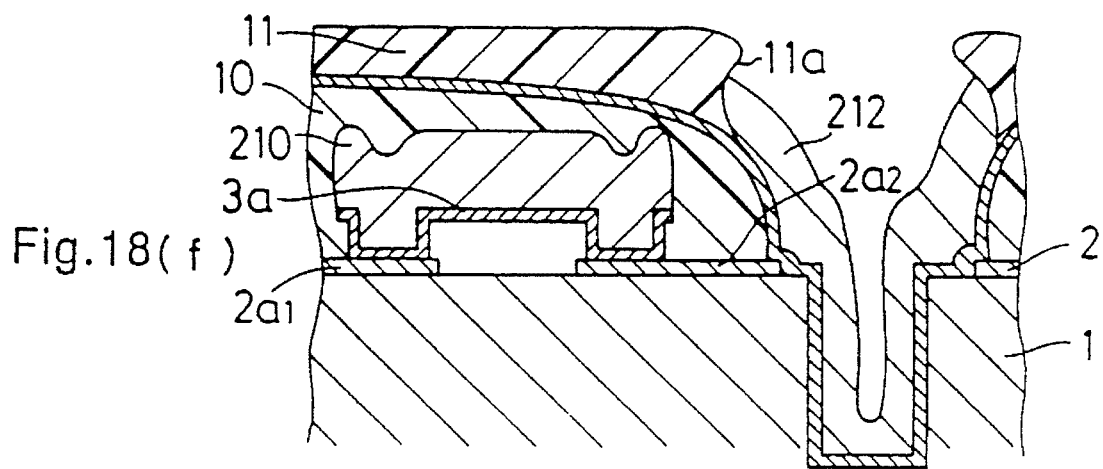
Figure 19A:
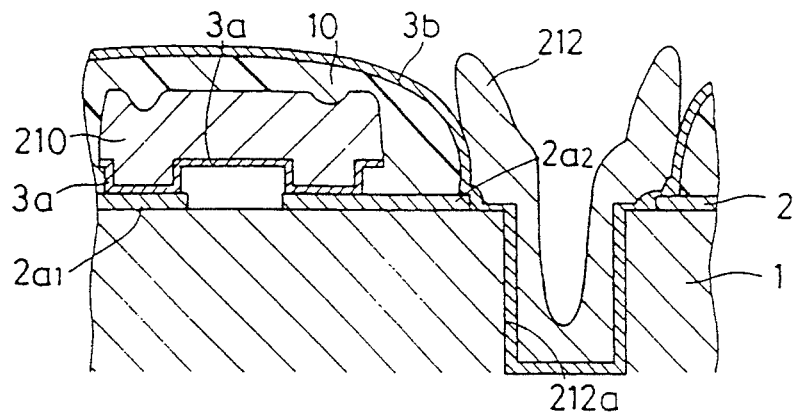
Figure 19B:
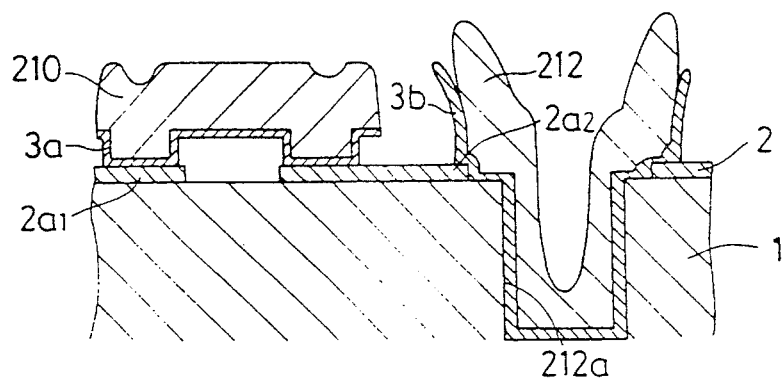
Figure 19C:
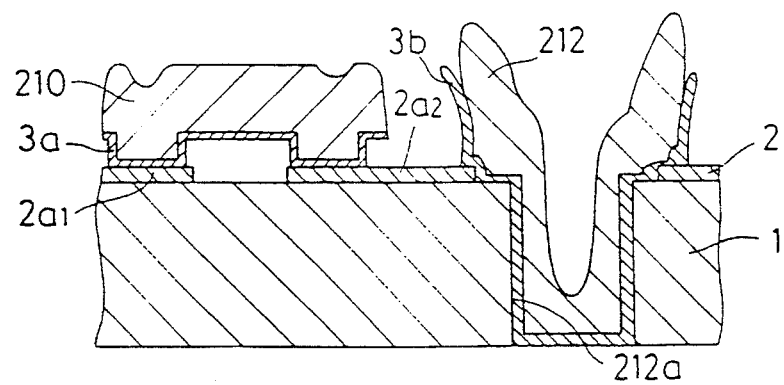
Figure 19D:
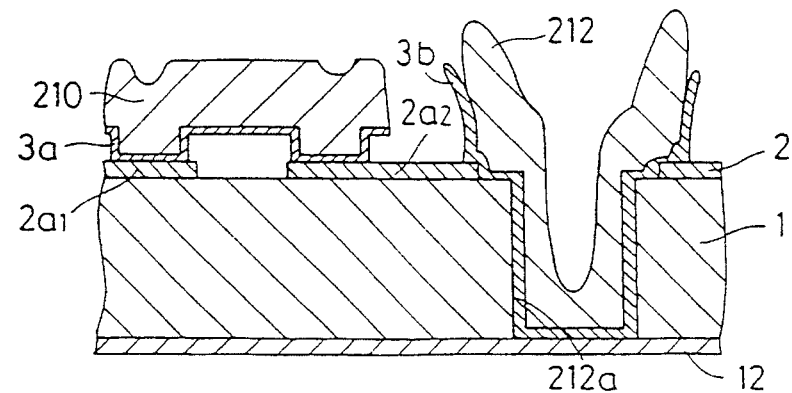
Figure 20:
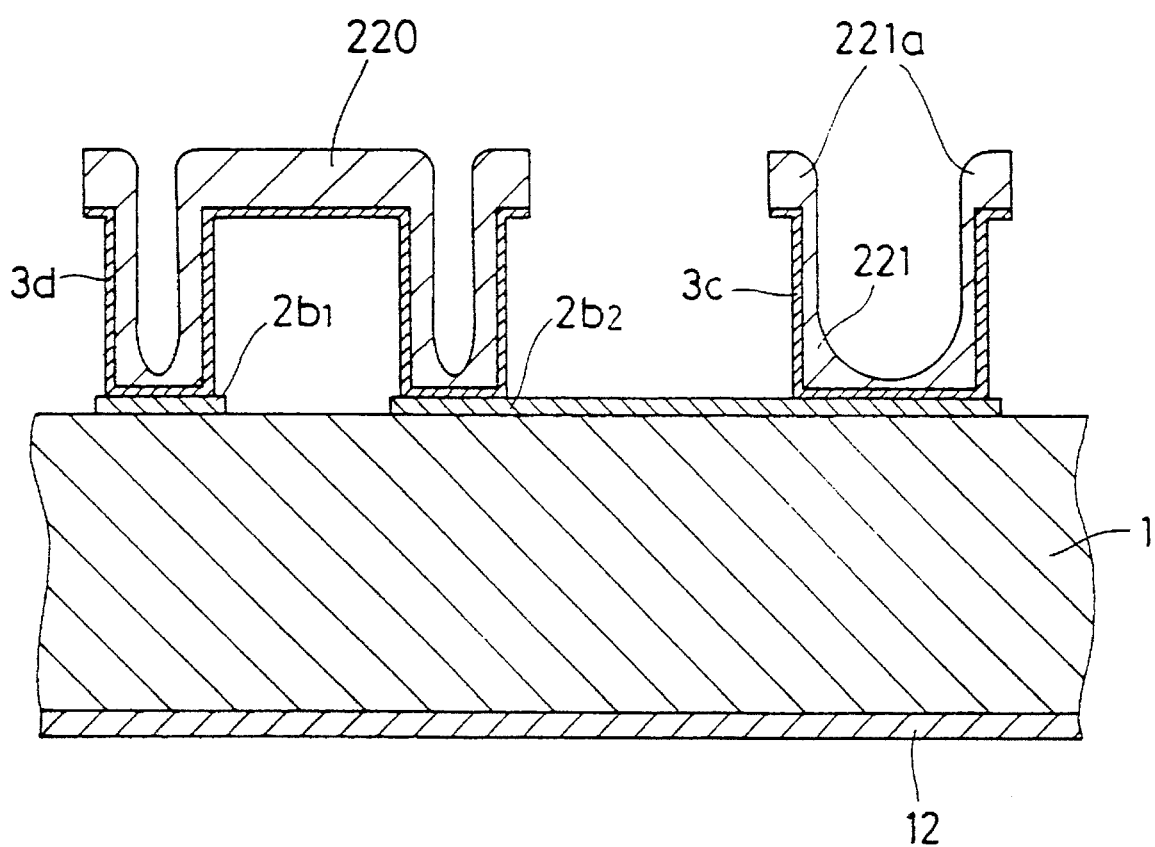
FIG. 20 is a sectional view illustrating a plated air-bridge wiring and a plate electrode as a bonding pad disposed in the vicinity of the air-bridge wiring, which are employed in a semiconductor device, such as a GaAs MMIC, according to the prior art.
Figure 21A:
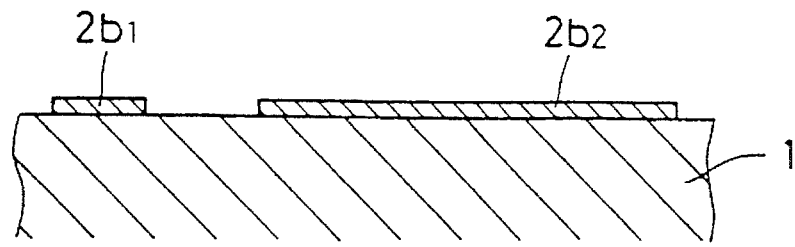
FIGS. 21(a)–21(d) and 22(a)–22(d) are sectional views illustrating process steps in a method of producing the structure shown in FIG. 20.
Figure 21B:
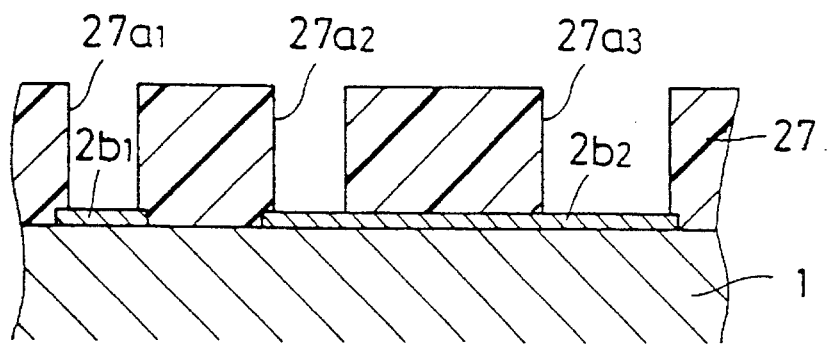
Figure 21C:
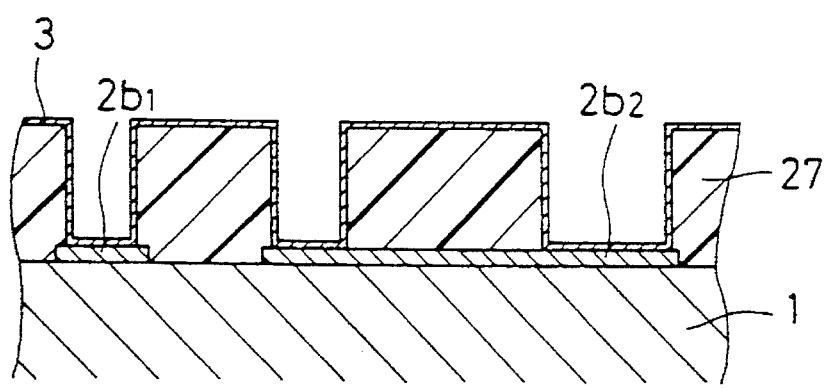
Figure 21D:
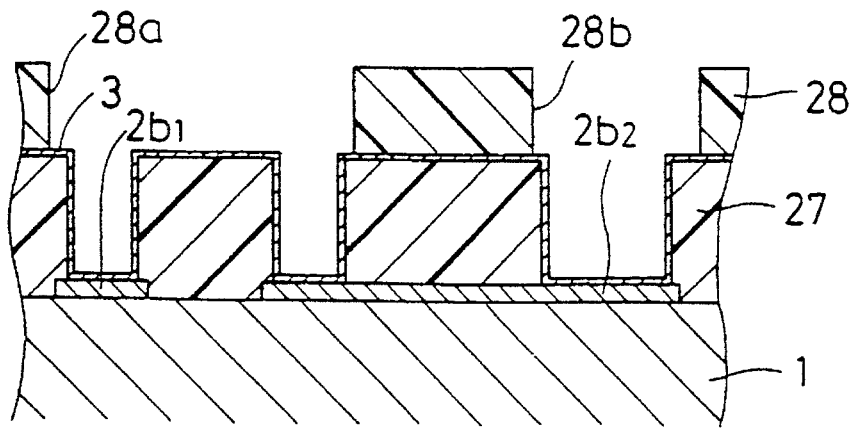
Figure 22A:
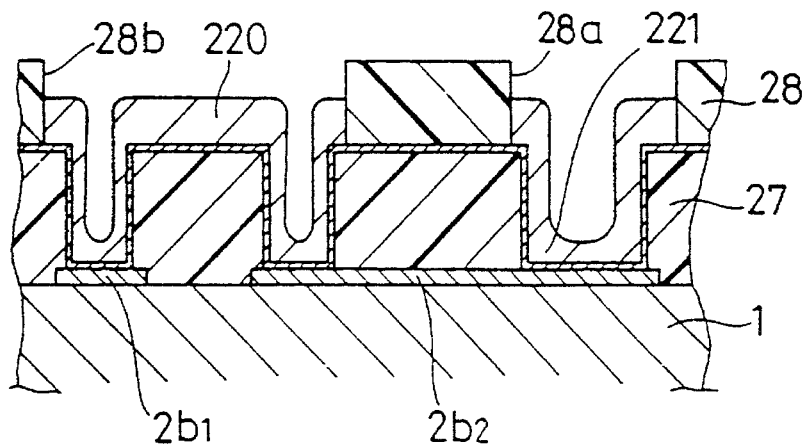
Figure 22B:
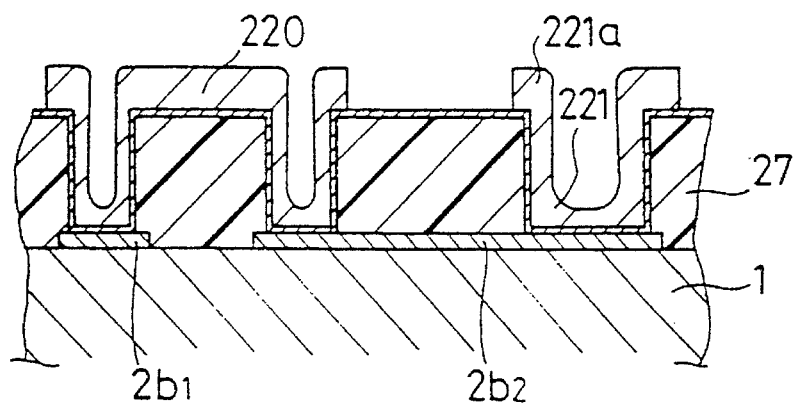
Figure 22C:
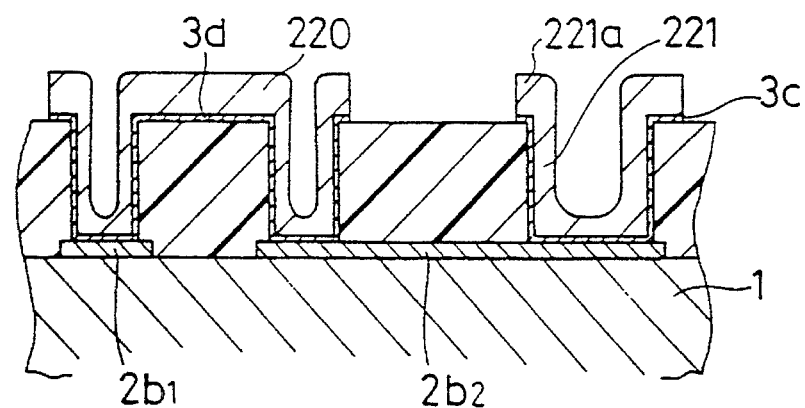
Figure 22D:
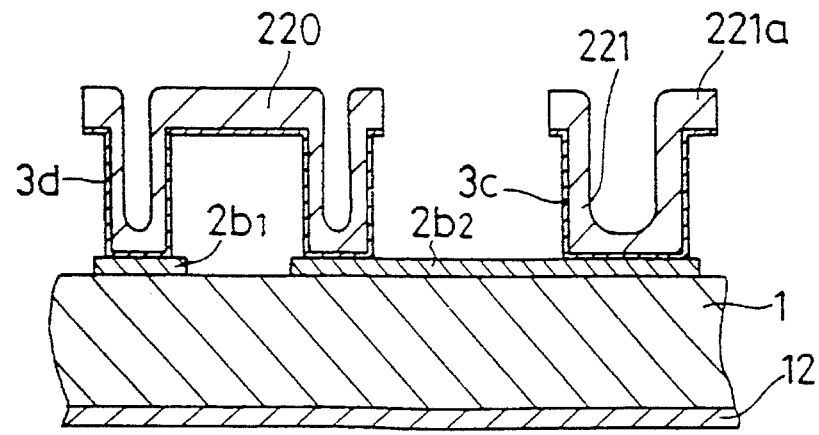

Initially, as illustrated in FIG. 3(a), lower electrodes $2a_1$ and $2a_2$, such as source electrodes of FETs, and a lower electrode 2 are formed on the front surface of the semi-insulating GaAs substrate 1. These lower electrodes are the same as those described with respect to FIG. 17(a) according to the prior art.

In the step of FIG. 3(b), a lower resist film 117 for selective plating is formed over the entire surface and patterned to form a spacer 117a between the lower electrodes $2a_1$ and $2a_2$. The spacer 117a corresponds to a space under an air-bridge wiring that will be formed later. A positive type resist that is suitable for making a fine pattern is employed for the lower resist film 117. The thickness of the lower resist film 117 is selected according to the height of the space under the air-bridge wiring. For example, it is 1 μm or 3 μm.

Thereafter, a lower feeding layer 13, such as a metal film having a laminated structure of Ti/Mo/Au, is formed over the entire surface to a thickness of 0.1 μm~0.3 μm by sputtering (FIG. 3(c)). Subsequently, a resist film 118 for selective etching is deposited on the lower feeding layer 13 and patterned to form an aperture 118a at a position on the GaAs substrate 1 where a via-hole is to be formed (FIG. 3(d)).

Using the resist film 118 as a mask, a portion of the feeding layer 13 exposed in the aperture 118a is removed by ion milling. Further, the GaAs substrate 1 is etched by RIE using the resist film 118 as a mask to form a via-hole 212a. After removal of the resist film 118 with a release solution, an upper feeding layer 23, such as a metal film having a laminated structure of Ti/Mo/Au, is formed over the entire surface to a thickness of 0.3 μm~0.4 μm by sputtering (FIG. 3(e)).

Thereafter, an upper resist film 119 for selective plating is deposited over the entire surface to a thickness equivalent to a prescribed height of the air-bridge wiring, for example, about 10 μm. The resist film 119 is patterned to form an aperture 119a (FIG. 3(f)). A negative type resist is employed for the upper resist film 119 because it can be completely removed from the via-hole 212a when the aperture 119a is formed. Although it is not shown in FIG. 3(f), the resist aperture 119a extends from the via-hole 211a to the via-hole 212a, across the first and second FETs 21 and 22.

Figure 4:
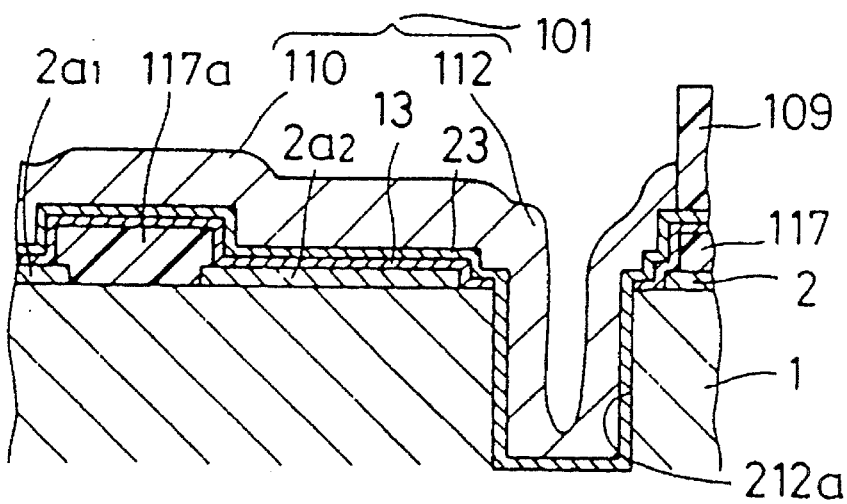
Figure 4:
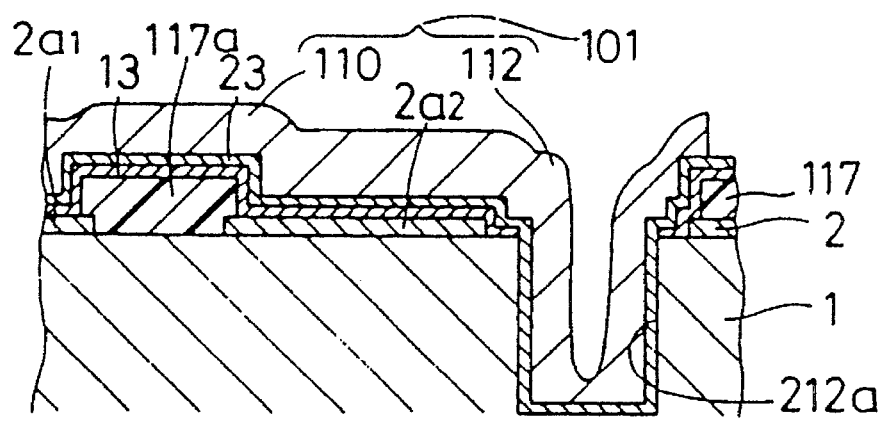
Figure 4:
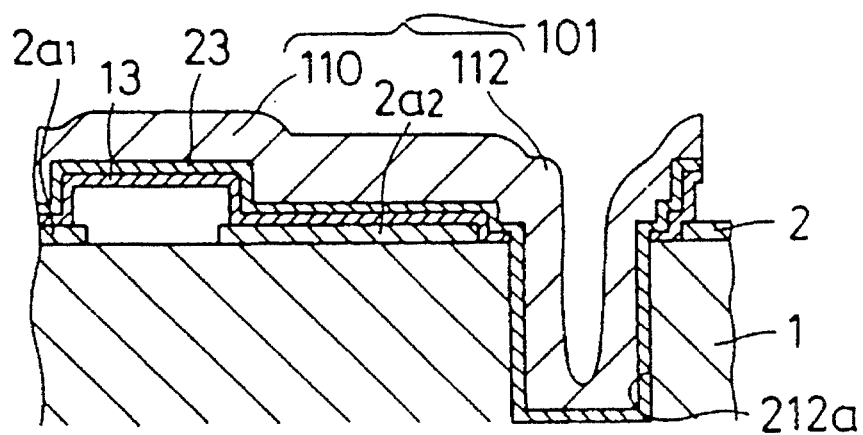
Figure 4:
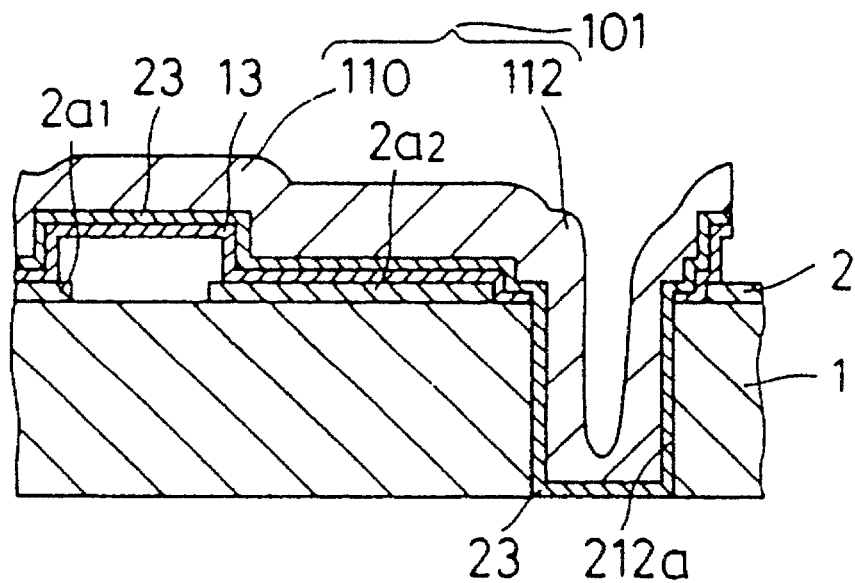
Figure 4:
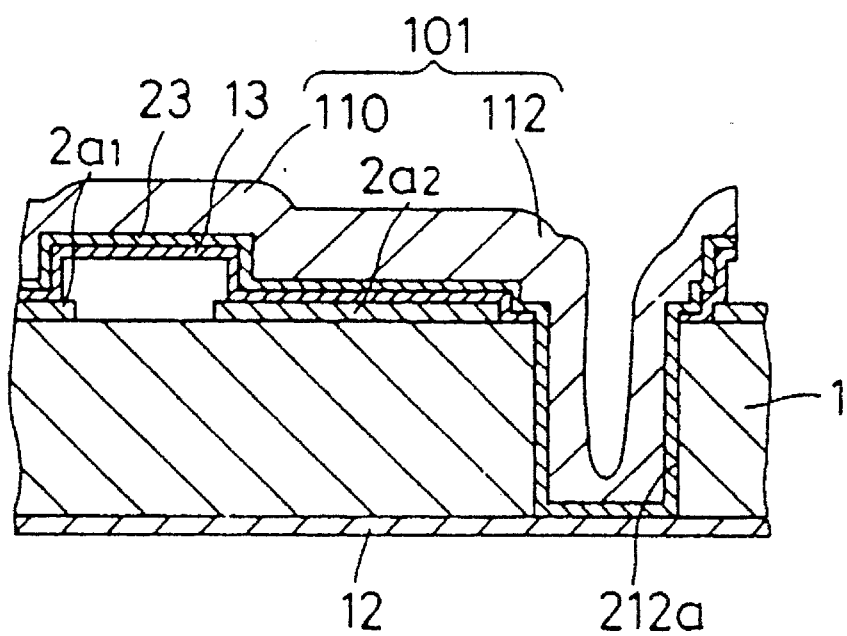

Using the upper resist film 119 as a mask, a metal layer 101 is grown in the resist aperture 119a by electroplating, forming an air-bridge wiring 110 and via-hole wirings 111 and 112 simultaneously in the metal layer 101 (FIG. 4(a)).

Thereafter, the upper resist film 119 is removed by ashing or a release solution using the plated metal layer 101 as a mask (FIG. 4(b)). The upper and lower feeding layers 23 and 13 are successively removed by ion milling, and the lower resist film 117 including the spacer 117a under the air-bridge wiring 110 is removed with a release solution (FIG. 4(c)).

After the above-described front surface processing of the GaAs substrate 1, the front surface of the substrate is adhered to a support plate (not shown), and the rear surface of the substrate is etched until the plated metal wiring 112 at the bottom of the via-hole 212a is exposed (FIG. 4(d)).

Thereafter, a rear electrode 12 is formed over the rear surface of the substrate 1 to complete the GaAs MMIC 100 (FIG. 4(e)).

In the GaAs MMIC 100, since the air-bridge wiring 110 and the via-hole wirings 111 and 112 are portions of the electroplated metal layer 101, the air-bridge wiring 110 and the via-hole wirings 111 and 112 are united with each other, i.e., connected through no additional wiring. Therefore, the junction of these wirings has no contact resistance. In addition, since these wirings and the junction are united with each other, the mechanical strength and the reliability of the junction are improved.

Furthermore, the height of the electroplated metal layer 101 at the periphery of the via-hole 212a (211a) is about the same as the height at the air-bridge portion. Therefore, when the rear surface of the substrate is etched with the front surface being adhered to a support plate, since an external force is not concentrated on a portion of the substrate, cracking and tilting of the substrate are avoided. In addition, since the tilting of the substrate is avoided, the thickness of the substrate can be accurately controlled during the rear surface etching process.

Further, since the feeding layer 13 (23) serving as a base of the electroplated metal layer has a multilayer structure of different metals, for example, Ti/Mo/Au, plural functions are given to the feeding layer 13 (23).

That is, since the feeding layer 13 (23) comprises a Ti layer at the bottom of the multilayer structure and the Ti layer has good adhesion to the underlying layers, the adhesive strength between the lower electrode on the surface of the substrate and the electroplated metal layer is increased, resulting in a highly-reliable device.

Further, the feeding layer 13 (23) comprises a Mo layer in the middle of the multilayer structure, and the Mo layer serves as a barrier metal layer that prevents diffusion of reactive elements. Therefore, even when the lower electrode comprises reactive materials, such as AuGe, the Mo layer prevents the reactive elements of the lower electrode from diffusing into the electroplated metal layer, whereby the characteristics of the electroplated metal layer are not degraded. In this case, it is not necessary to form a barrier metal layer in the lower electrode or between the lower electrode and the feeding layer. The material of the barrier metal layer is not restricted to Mo. Other materials, for example, Pt or TiN, may be employed.

In the process according to this first embodiment of the invention, after the formation of the first resist film 117 having a pattern of the air-bridge wiring, the first feeding layer 13 is formed over the entire surface and, thereafter, the first feeding layer and the substrate are etched using the second resist film 118 having a pattern of the via-hole as a mask. Then, the second feeding layer 23 is formed, and the electroplating is carried out using the third resist film 119 having a prescribed pattern as a mask to form the air-bridge wiring 110 and the via-hole wirings 111 and 112 in an electroplated layer. Therefore, the air-bridge wiring 110 and the via-hole wirings 111 and 112 are produced in the same electroplating process, whereby the production process is significantly simplified.

Further, after the formation of the mask layer (first resist film 117) for the selective plating of the narrow portion of the air-bridge wiring, the via-holes are formed using the second resist film 118 as an etching mask and, thereafter, the selective electroplating is carried out to form the air-bridge wiring 110 and the via-hole wirings 111 and 112 at the same time. Therefore, it is not necessary to form a resist mask on the high step portions of the substrate due to the via-hole and the air-bridge wiring, so that the troubles in the production process caused by the poor coverage of the resist mask are avoided. Consequently, degradation in the characteristics of the device due to troubles in the production is avoided.

Furthermore, since the formation of the feeding layer for the electroplating is divided into two steps, the respective feeding layers 13 and 23 are formed under optimum conditions.

While in the above-described first embodiment each of the first and second feeding layers 13 and 23 comprises a three-layer structure of Ti/Mo/Au, the materials of the feeding layer are not restricted thereto. For example, if the first feeding layer 13 comprises a reactive material that can be dry-etched, such as Ti, Mo, TiN, or W, the removal of the first feeding layer and the formation of the via-hole can be successively carried out in a dry etching process, whereby the production process is significantly simplified.

Further, when the first feeding layer is removed using the electroplated metal layer as a mask (FIG. 4(c)), if reactive dry etching, such as reactive ion etching, that does not etch the electroplated metal layer but etches the feeding layer is employed, unwanted reduction in the thickness of the electroplated metal layer is avoided, whereby the uniformity of the thickness of the electroplated metal layer is improved.

While in the above-described first embodiment an ordinary photosensitive resin is employed as the first resist film 117 for patterning the air-bridge wiring, the resist film 117 may comprise a polyimide resin that is resistant to heat and stress. In this case, the first resist film 117 is not deformed very much by stress from the overlying feeding layer, so that disconnection of the feeding layer caused by the deformation of the resist film is avoided. Consequently, the air-bridge wiring is formed with high reliability and uniformity.

Furthermore, although the second feeding layer 23 is formed by sputtering, it may be formed by electroless plating. In this case, the coverage of the second feeding layer is improved at the high step portions on the surface of the substrate where the via-hole is present. In addition, the uniformity of the thickness of the second feeding layer at the bottom of the via-hole is improved.

[Embodiment 2]

Figure 5:
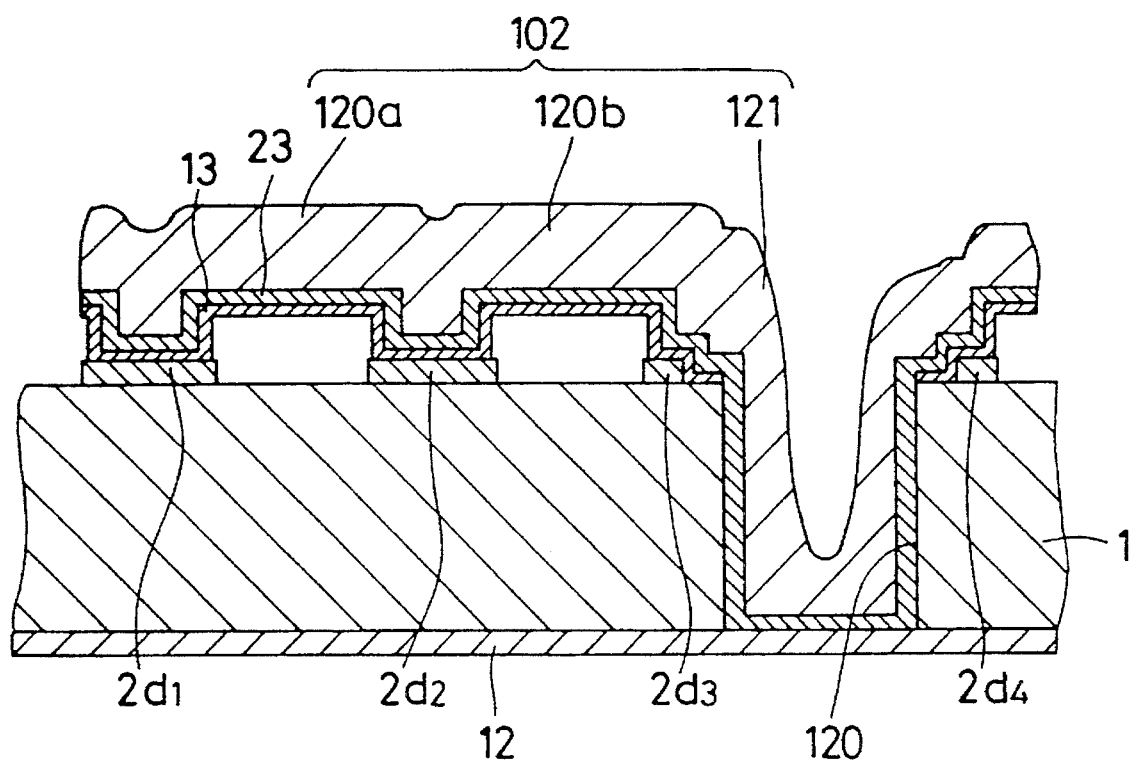
FIG. 5 is a sectional view illustrating an air-bridge wiring and via-hole wiring connecting structure employed in a semiconductor device in accordance with a second embodiment of the present invention.

FIG. 5 is a sectional view illustrating a part of a GaAs MMIC in accordance with a second embodiment of the present invention, in which two air-bridge wirings and a via-hole wiring are united with each other in an electroplated metal layer.

In the figure, reference numeral 1 designates a semi-insulating GaAs substrate having opposite front and rear surfaces. First to fourth lower electrodes $2d_1$–$2d_4$ are disposed on prescribed positions of the front surface of the substrate 1. A via-hole 121 is located between the third lower electrode $2d_3$ and the fourth lower electrode $2d_4$. A first air-bridge wiring 120a connects the first lower electrode $2d_1$ to the second lower electrode $2d_2$, and a second air-bridge wiring 120b connects the second lower electrode $2d_2$ to the third lower electrode $2d_3$. A via-hole wiring 121 connects the third and fourth lower electrodes $2d_3$ and $2d_4$ to a rear electrode 12 disposed on the rear surface of the substrate 1. In this structure, the first and second air-bridge wirings 120a and 120b and the via-hole wiring 121 are united in an electroplated metal layer 102.

A description is given of process steps in producing the air-bridge wirings 120a and 120b and the via-hole wiring 121 in a method of producing the GaAs MMIC shown in FIG. 5.

FIGS. 6(a)–6(f) show process steps of forming a lower resist film for selective electroplating, a via-hole, and feeding layers. FIGS. 7(a)–7(f) show process steps of forming the air-bridge wirings and the via-hole wiring by electroplating.

Figure 6A:
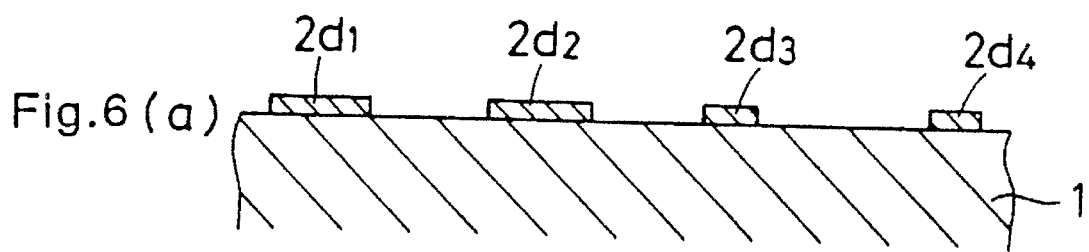
Figure 6B:
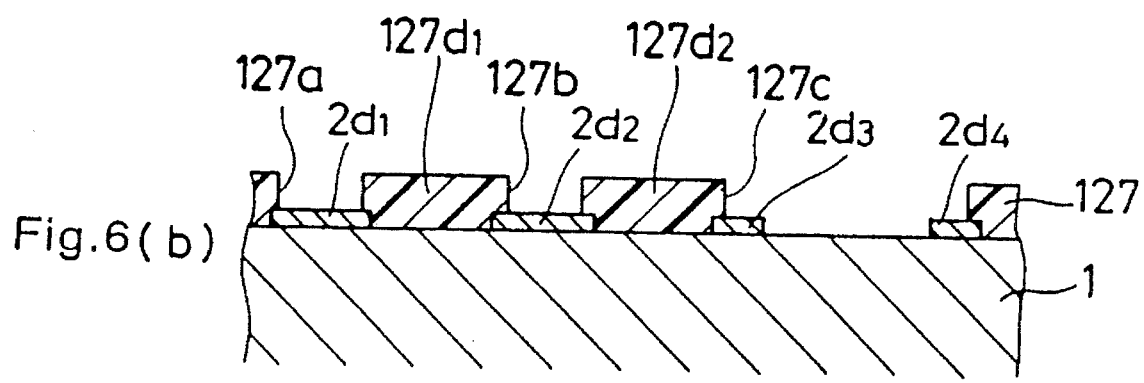

Initially, on the front surface of the GaAs substrate 1 where the lower electrodes $2d_1$–$2d_4$ are disposed as shown in FIG. 6(a), a positive type lower resist film 127 for selective electroplating is deposited and patterned, leaving spacers $127d_1$ and $127d_2$ at positions between the lower electrodes $2d_1$ and $2d_2$ and between the lower electrodes $2d_2$ and $2d_3$, respectively (FIG. 6(b)). These spacers correspond to spaces under the air-bridge wirings. In addition, resist apertures 127a and 127b corresponding to metal posts of the air-bridge wiring are formed on the first and second lower electrodes $2d_1$ and $2d_2$, respectively, and a resist aperture 127c is formed opposite a position where a via-hole is to be formed.

Figure 6C:
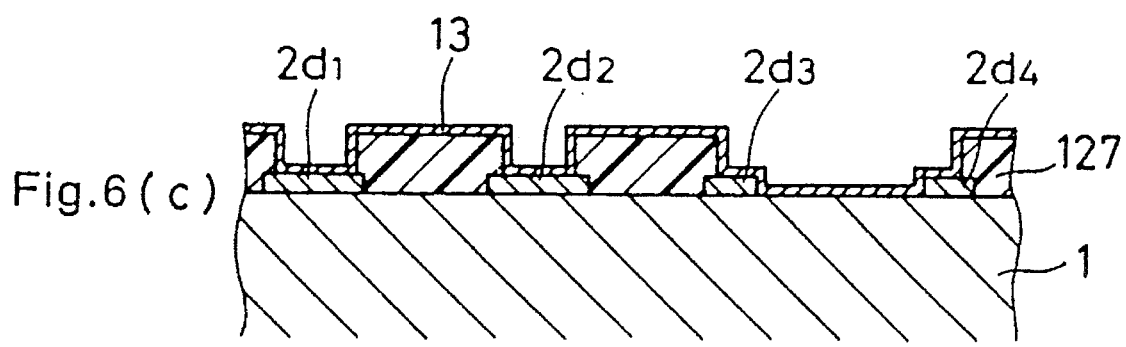
Figure 6D:
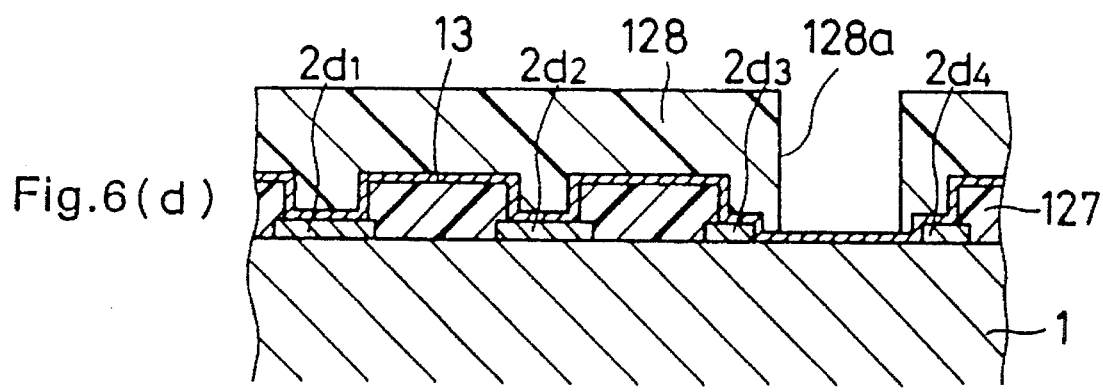

Thereafter, a lower feeding layer 13 having a three-layer structure of Ti/Mo/Au is formed by sputtering (FIG. 6(c)). A resist film 128 for selective etching is deposited on the feeding layer 13 and patterned to form a resist aperture 128a opposite a region of the substrate 1 where the via-hole is to be formed (FIG. 6(d)).

Figure 6E:
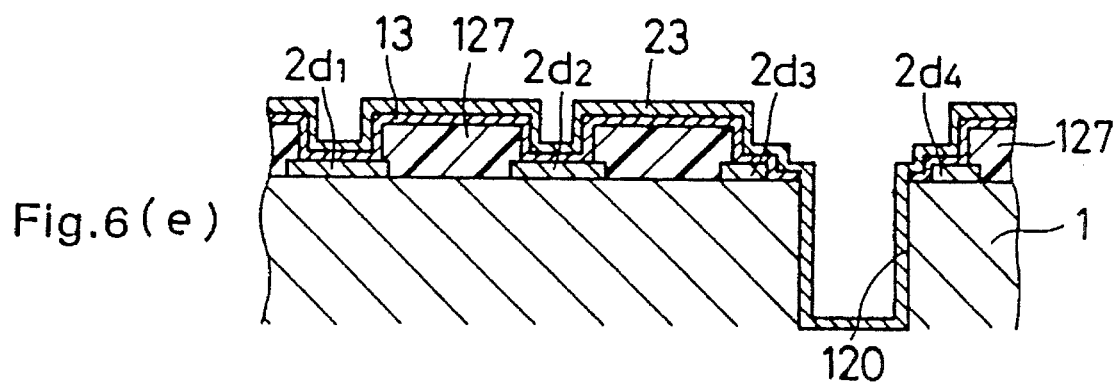

In the step of FIG. 6(e), using the patterned resist film 128 as a mask, the substrate 1 is etched to form a via-hole 120. After removal of the resist film 128, an upper feeding layer 23 having the same structure as that of the first embodiment is formed.

Figure 6F:
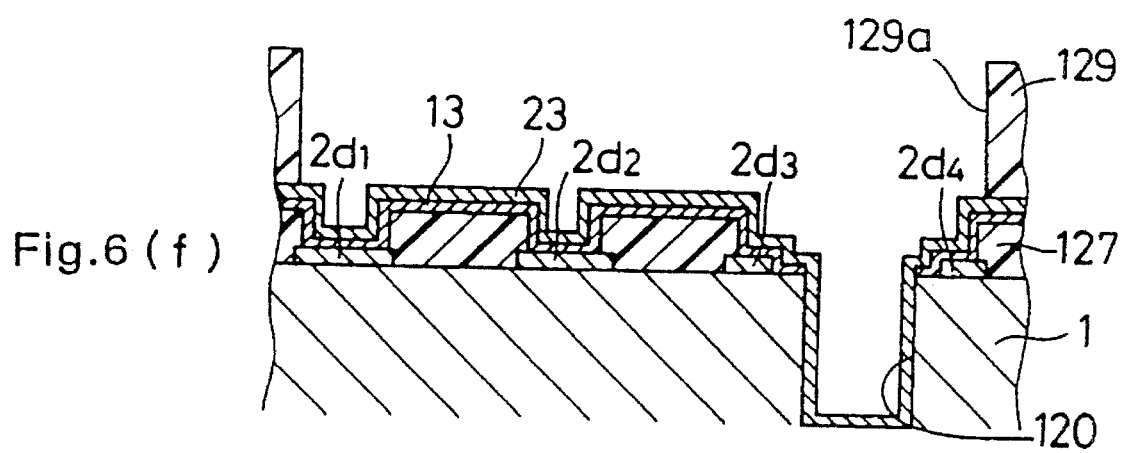

In the step of FIG. 6(f), an upper resist film 129 for selective electroplating is deposited to a thickness equivalent to a prescribed height of the air-bridge wiring, for example, about 10 μm. Then, the resist film 129 is patterned to form an aperture 129a on a region from the first lower electrode $2d_1$ to the fourth lower electrode $2d_4$ across the via-hole 120.

Using the resist film 129 as a mask, a metal layer 102 is deposited in the resist aperture 129a by electroplating (FIG. 7(a)), forming first and second air-bridge wirings 120a and 120b and a via-hole wiring 121 which are united in the electroplated metal layer 102.

After removal of the upper resist film 129 (FIG. 7(b)), the upper and lower feeding layers 23 and 13 and the lower resist film 127 are removed (FIG. 7(c)).

Figure 7D:
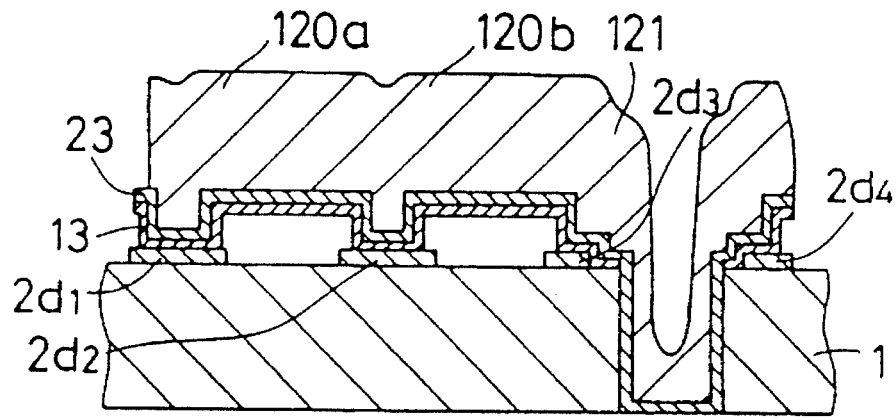
Figure 7E:
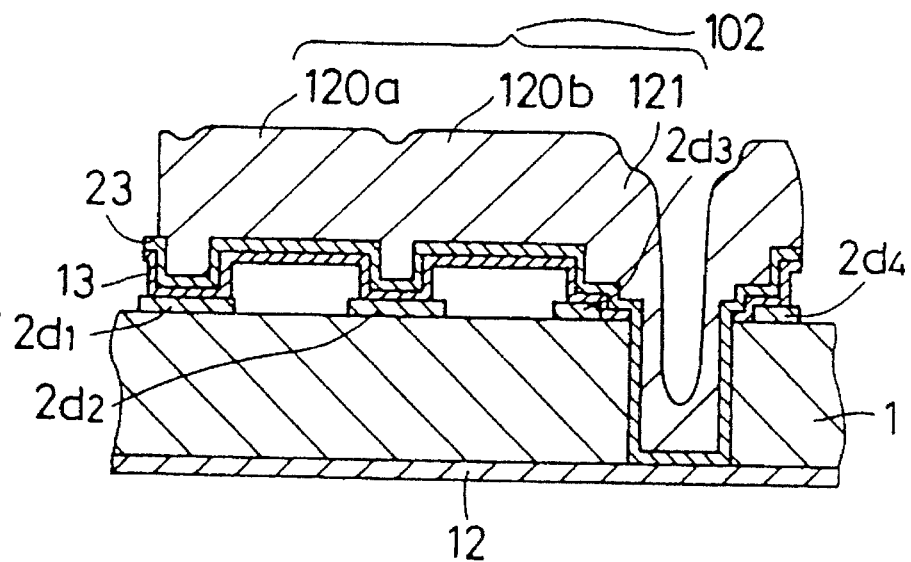

After the above-described processing on the front surface, the rear surface of the substrate 1 is etched (FIG. 7(d)), and a rear electrode 12 is formed over the rear surface of the substrate 1 (FIG. 7(e)), completing the GaAs MMIC shown in FIG. 5.

Also in this second embodiment of the invention, the same effects as described in the first embodiment are achieved.

[Embodiment 3]

Figure 8:
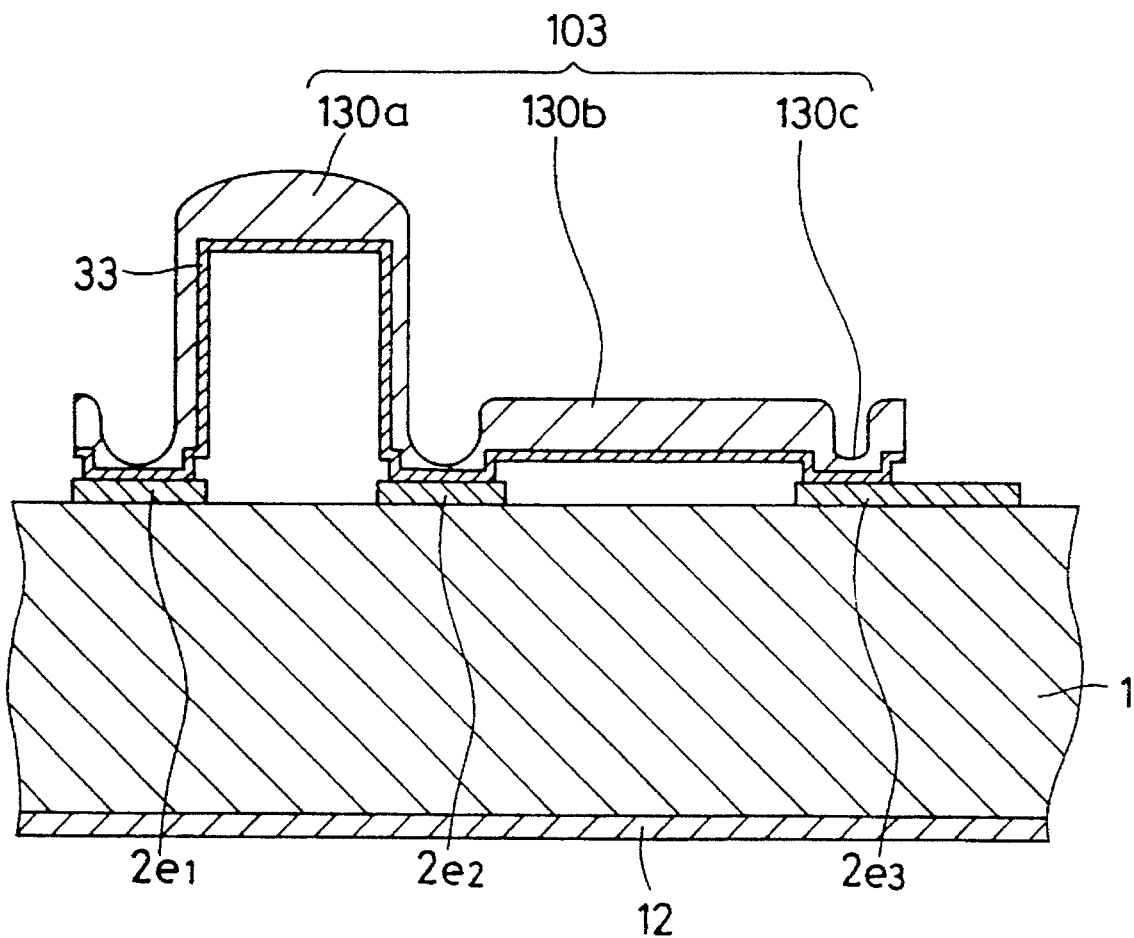
FIG. 8 is a sectional view illustrating air-bridge wirings having different heights employed in a semiconductor device in accordance with a third embodiment of the present invention.

FIG. 8 is a sectional view of a part of a GaAs MMIC in accordance with a third embodiment of the present invention.

In FIG. 8, reference numeral 1 designates a semi-insulating GaAs substrate having opposite front and rear surfaces. First to third lower electrodes $2e_1$ to $2e_3$ are disposed on the front surface of the GaAs substrate 1. A relatively high air-bridge wiring 130a connects the first lower electrode $2e_1$ to the second lower electrode $2e_2$, and a relatively low air-bridge wiring 130b connects the second lower electrode $2e_2$ to the third lower electrode $2e_3$. A fine wiring 130c is disposed on an end of the third lower electrode $2e_3$.

In this third embodiment, the relatively high air-bridge wiring 130a, the relatively low air-bridge wiring 130b, and the fine wiring 130c are united in an electroplated metal layer 103.

A description is given of process steps of forming the air-bridge wirings 130a and 130b and the via-hole wiring 130c in a method of producing the GaAs MMIC according to the third embodiment of the invention.

FIGS. 9(a)–9(d) are sectional views illustrating process steps of producing first and second lower resist films as masks for selective electroplating and a feeding layer. FIGS. 10(a)–10(e) are sectional views illustrating process steps of producing the air-bridge wirings having different heights and the fine wiring by electroplating.

Figure 9C:
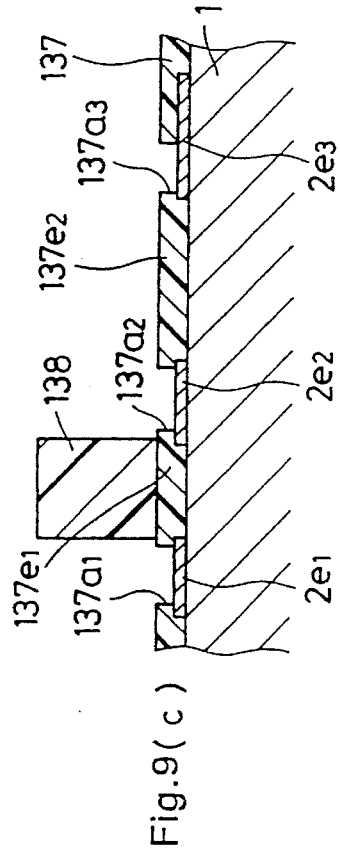
FIGS. 9(a)–9(d) and 10(a)–10(e) are sectional views illustrating process steps in a method of producing the structure shown in FIG. 8.
Figure 9D:
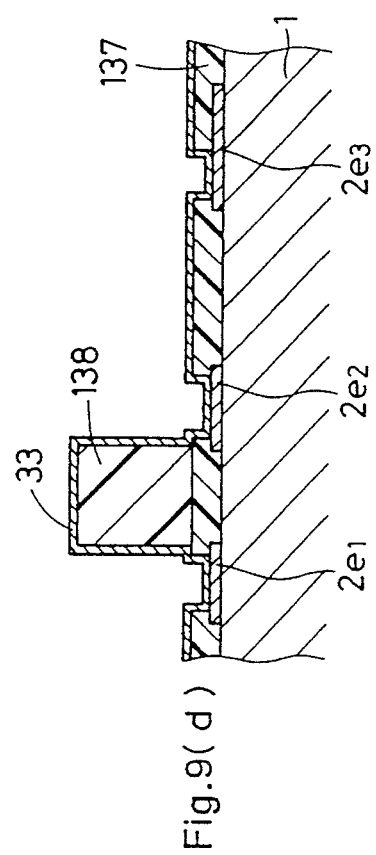
Figure 9A:
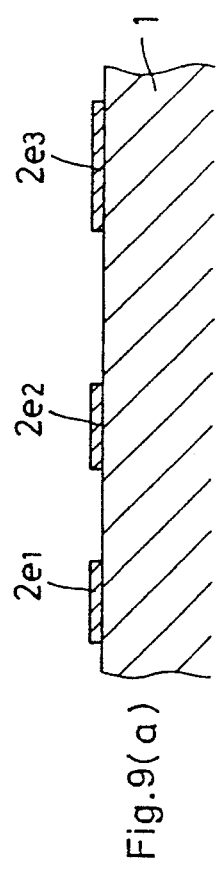
Figure 9B:
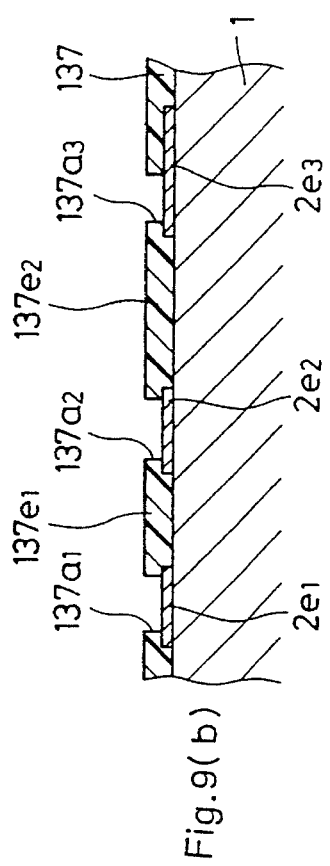

Initially, on the front surface of the GaAs substrate 1 where the lower electrodes $2e_1$–$2e_3$ are disposed, as shown in FIG. 9(a), a positive type lower resist film 137 for selective electroplating is deposited and patterned so that spacers $137e_1$ and $137e_2$ corresponding to spaces under the air-bridge wirings are left at positions between the lower electrodes $2e_1$ and $2e_2$ and between the lower electrodes $2e_2$ and $2e_3$, respectively (FIG. 9(b)). In addition, resist apertures $137a_1$–$137a_3$ are formed simultaneously with the spacers. The resist apertures $137a_1$ and $137a_2$ correspond to metal posts of the air-bridge wirings, and the resist aperture $137a_3$ corresponds to a region where the fine wiring is to be formed.

Thereafter, a second lower resist film is deposited over the spacer $137e_1$ and patterned to form an upper spacer 138 (FIG. 9(c)). Subsequently, a lower feeding layer 33 having a three-layer structure of Ti/Mo/Au is formed over the entire surface by sputtering (FIG. 9(d)). If the first lower resist film 137 and the second lower resist film 138 is formed under different conditions, for example, different temperatures in the baking process, the second lower resist 138 can be selectively developed to the lower spacer comprising the first lower resist film.

Figure 10A:
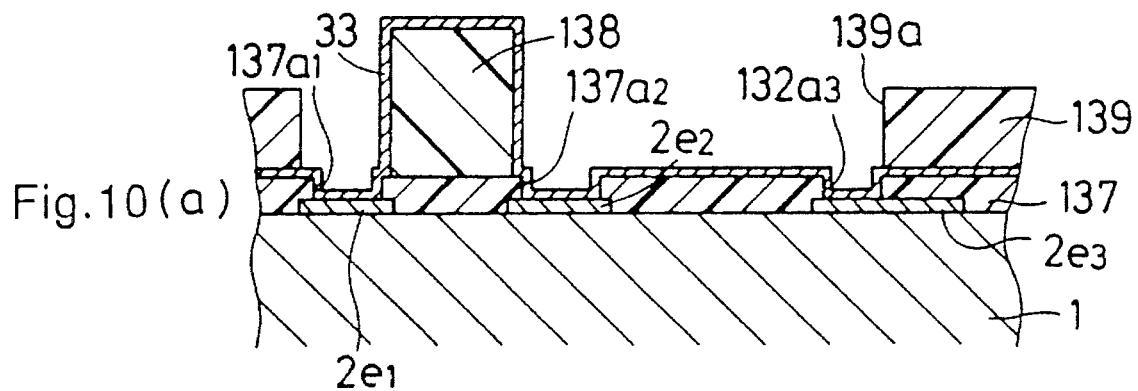

Thereafter, an upper resist film 139 for selective electroplating is deposited over the entire surface to a prescribed thickness and patterned to form an aperture 139a on a region from the first resist aperture $137a_1$ to the third resist aperture $137a_3$ (FIG. 10(a)).

Figure 10B:
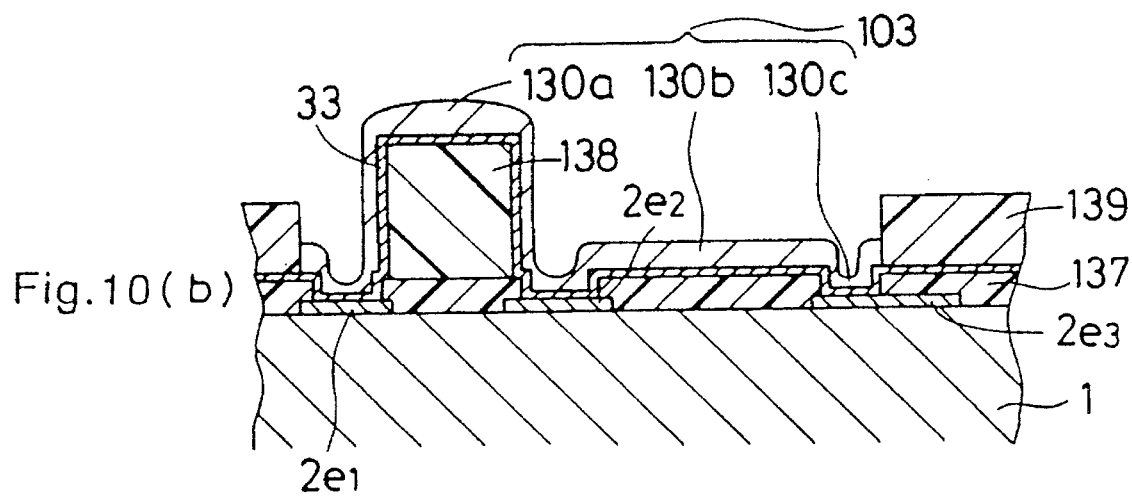

Using the upper resist film 139 as a mask, a metal layer 103 is grown in the resist aperture 139a by electroplating (FIG. 10(b)), forming a relatively high air-bridge wiring 130a, a relatively low air-bridge wiring 130b, and a fine wiring 130c which are united in the electroplated metal layer 103.

Figure 10C:
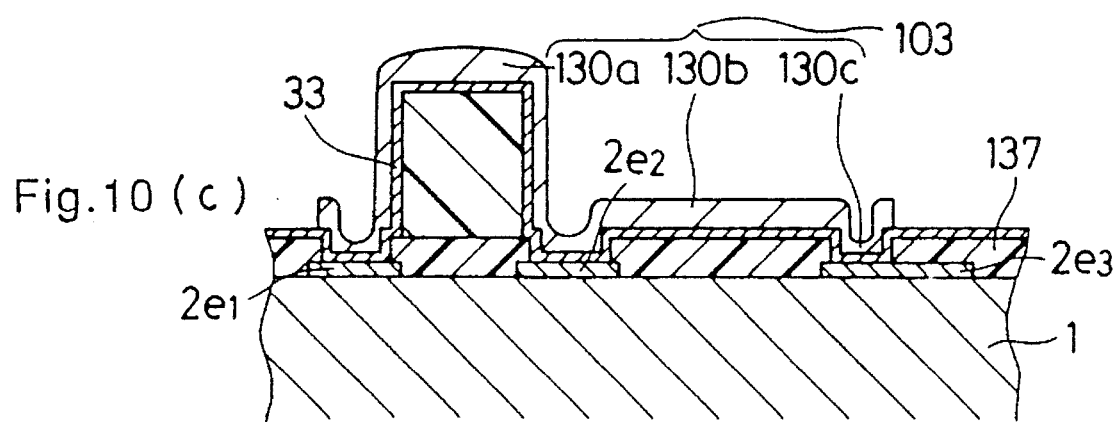
Figure 10:
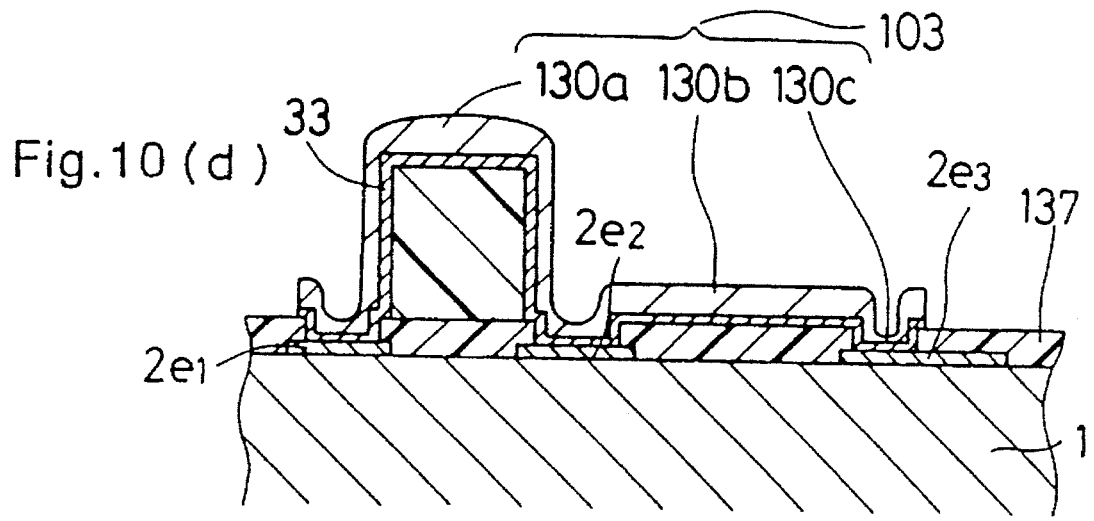
Figure 10:
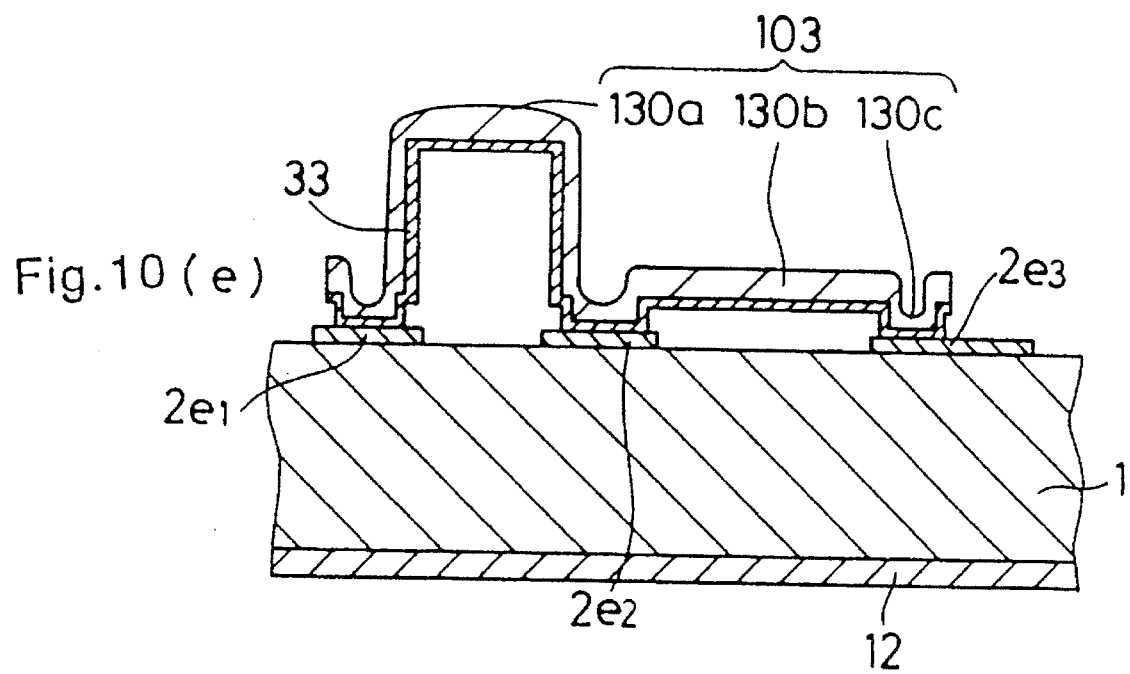

After removal of the upper resist film 139 with a release solution (FIG. 10(c)), the feeding layer 33 is removed by ion milling (FIG. 10(d)). Further, the lower resist films 138 and 137 are removed with a release solution. To complete the GaAs MMIC, the rear surface of the substrate is etched and a rear electrode 12 is produced (FIG. 10(e)).

In the GaAs MMIC according to the third embodiment of the invention, the relatively high air-bridge wiring 130a, the relatively low air-bridge wiring 130b, and the fine wiring 130c are united in the electroplated metal layer 103, i.e., these wirings are connected to each other without additional wirings. Therefore, junctions of the respective wirings have no contact resistance. In addition, the mechanical strength and the reliability of the junctions are improved.

Further, in the production process according to the third embodiment of the invention, the fine wiring 130c and the relatively low air-bridge wiring 130b are patterned using the relatively thin first resist film 137, and the relatively high air-bridge wiring 130a is patterned using both the relatively thin first resist film 137 and the relatively thick second resist film 138. Therefore, a sufficiently high air-bridge wiring 137 is formed while a thin and narrow wiring 130c is formed regardless of the height of the air-bridge wiring 130a, whereby the height of the frame-shaped swollen portion at the bonding pad part of the wiring 130c is significantly reduced. As the result, the bonding pad part has a resistance to vibration or the like, so that the bonding process is facilitated.

Furthermore, the relatively low air-bridge wiring 130b is formed simultaneous with the relatively high air-bridge wiring 130a. Consequently, the process steps of producing the air-bridge wirings having different heights and the plated fine wiring are significantly simplified.

[Embodiment 4]

Figure 11:
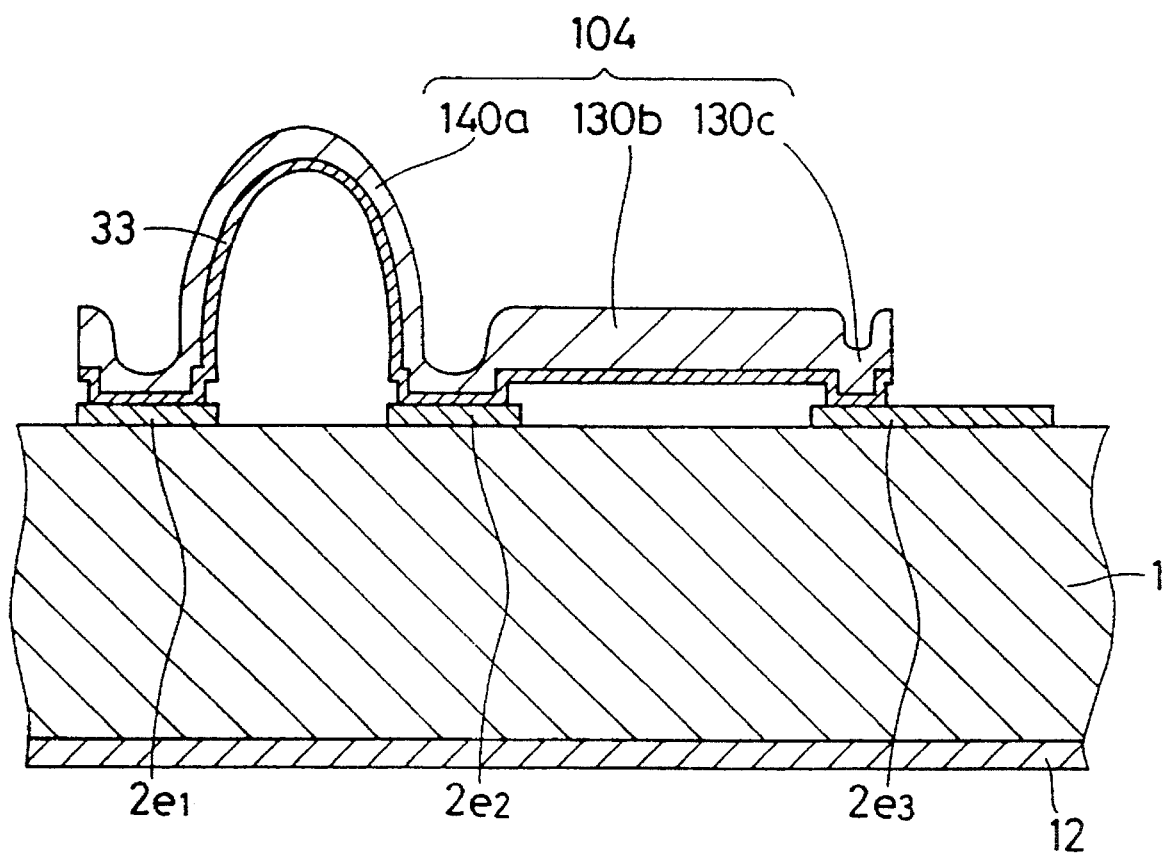
FIG. 11 is a sectional view illustrating air-bridge wirings having different heights employed in a semiconductor device in accordance with a fourth embodiment of the present invention.

FIG. 11 is a sectional view illustrating two air-bridge wirings having different heights and an ordinary wiring which are employed in a GaAs MMIC in accordance with a fourth embodiment of the present invention. In FIG. 11, the same reference numerals as in FIG. 8 designate the same or corresponding parts. A relatively high arched air-bridge wiring 140a connects-the first lower electrode $2e_1$ to the second lower electrode $2e_2$. In this fourth embodiment, the relatively high arched air-bridge wiring 140a, a relatively low air-bridge wiring 130b, and a fine wiring 130c are united in an electroplated metal film 104.

A method of producing the GaAs MMIC shown in FIG. 11 will be described, emphasizing the process steps of producing the air-bridge wirings 140a and 130b and the fine wiring 130c.

FIGS. 12(a)–12(d) are sectional views illustrating process steps of forming first and second lower resist layers as masks for selective plating and a feeding layer, and FIGS. 13(a)–13(e) are sectional views illustrating process steps of forming the air-bridge wirings 140a, 130b, and 130c by electroplating.

Initially, a lower resist film 137 is deposited over a GaAs substrate 1 having lower electrodes $2e_1$–$2e_3$ and patterned to form spacers $137e_1$ and $137e_2$ (FIGS. 12(a) and 12(b)). Thereafter, a second lower resist film is deposited and patterned on the spacer $137e_1$ in a region where the relatively high air-bridge wiring 140a is to be formed, and the upper surface of the second lower resist pattern is curved outwards, i.e., the upper end of the resist pattern is rounded, utilizing thermal deformation of the resist in a backing process, whereby a second spacer 148 is formed as shown in FIG. 12(c).

Thereafter, a lower feeding layer 43 is formed by vacuum vapor deposition (FIG. 12(d)). Thereafter, using an upper resist film 130 having an aperture 139a as a mask, a metal film 104 is selectively electroplated in the aperture 139a (FIGS. 13(a) and 13(b)), whereby a relatively high arched air-bridge wiring 140a and a relatively low air-bridge wiring 130b, and a fine wiring 130c are formed simultaneously.

Figure 13A:
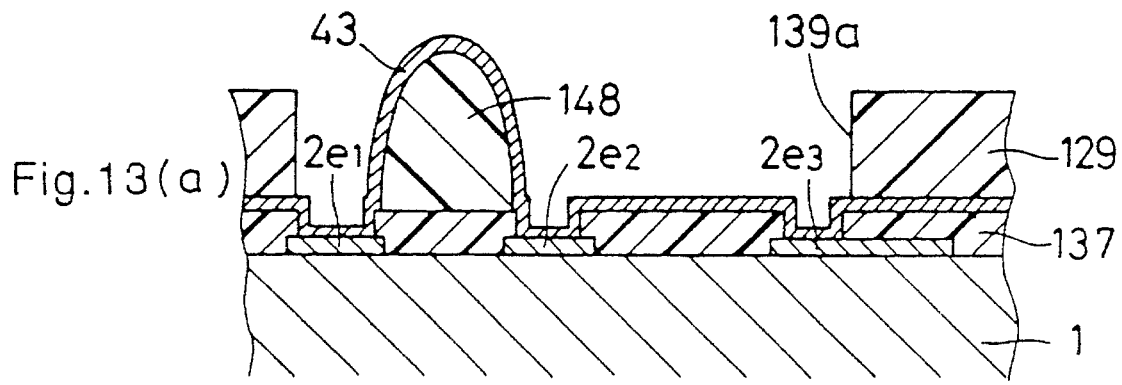
Figure 13B:
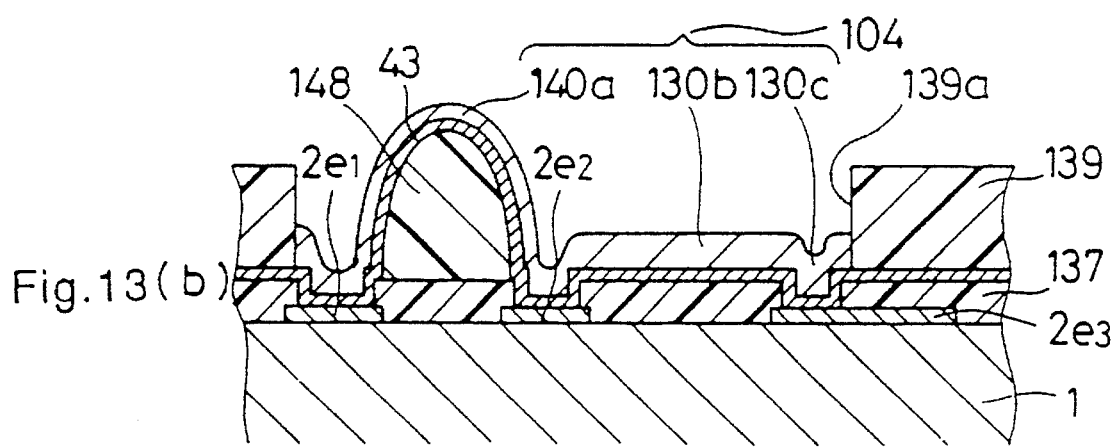
Figure 13C:
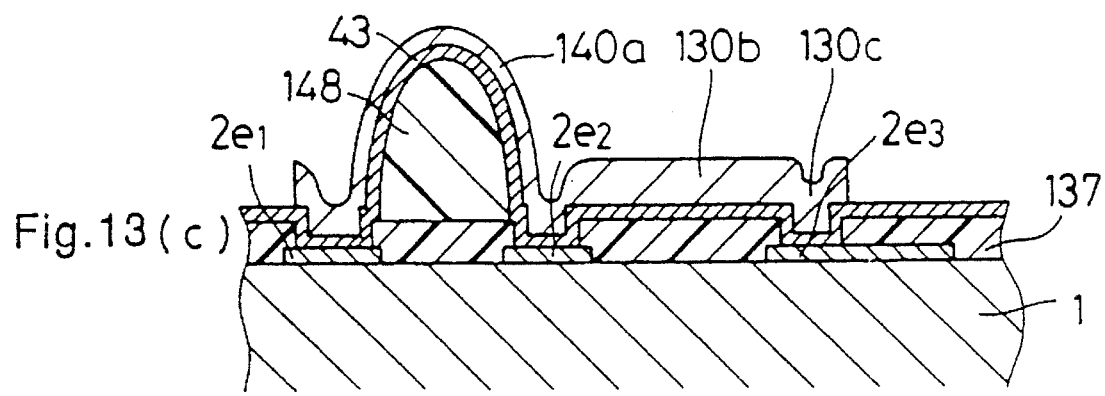
Figure 13D:
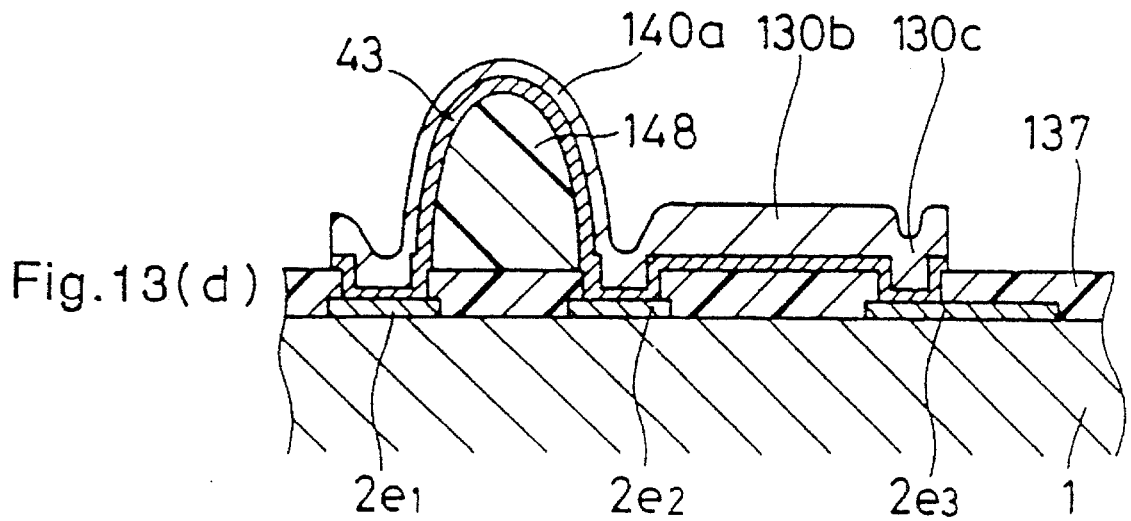
Figure 13E:
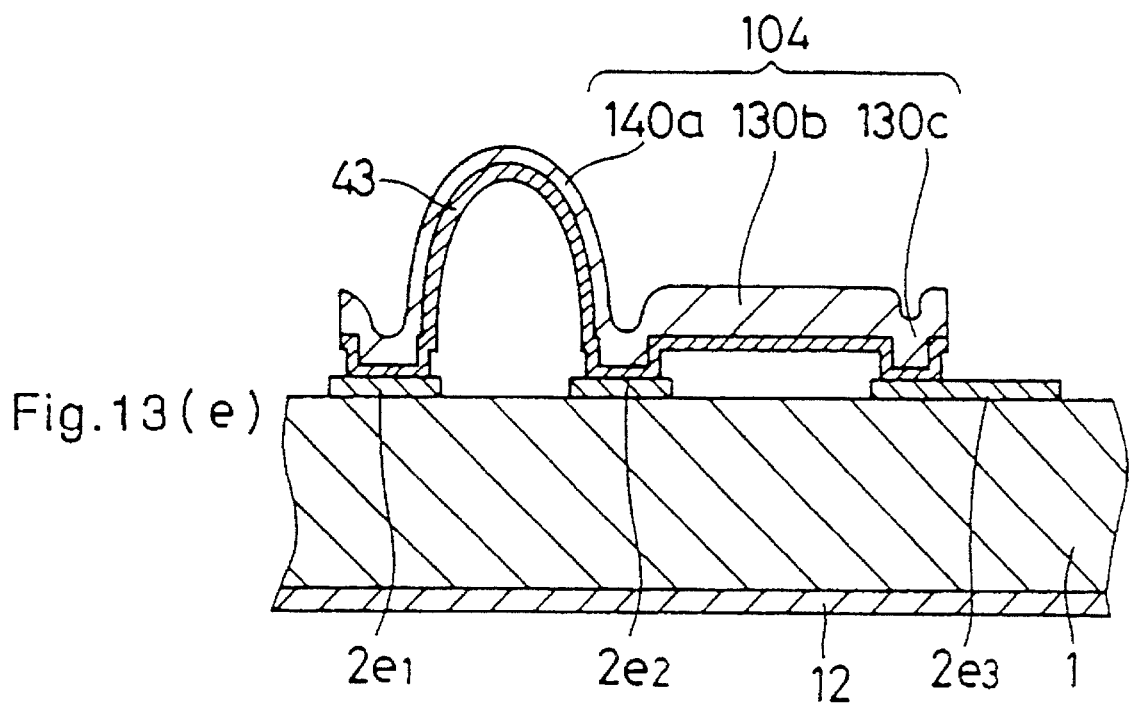

After removal of the upper resist film 139 with a release solution (FIG. 13(c)) and removal of the feeding layer 43 by ion milling (FIG. 13(d)), the lower resist films 148 and 137 are removed. Thereafter, the rear surface of the substrate is etched, and a rear electrode 12 is formed on the rear surface of the substrate to complete a GaAs MMIC (FIG. 13(e)).

In this fourth embodiment of the present invention, in addition to the effects of the above-described third embodiment, since the air-bridge wiring 140a has the arched structure in which the center portion of the wiring protrudes upward, the mechanical strength of the wiring is increased.

In the production process according to the fourth embodiment, in addition to the effects of the third embodiment, since the second resist film 148 serving as a spacer for producing a space under the air-bridge wiring is rounded by thermal treatment, the arched air-bridge wiring 140a having a high mechanical strength is easily produced.

Further, since the resist film 148 is subjected to baking, the resistances of the resist film to heat and pressure are increased.

Further, since the feeding layer is formed by vapor deposition, the energy of the material particles that strike the lower resist films 137 and 148 is reduced as compared to sputtering and damage of the lower resist films 137 and 148 is reduced.

[Embodiment 5]

Figure 23:
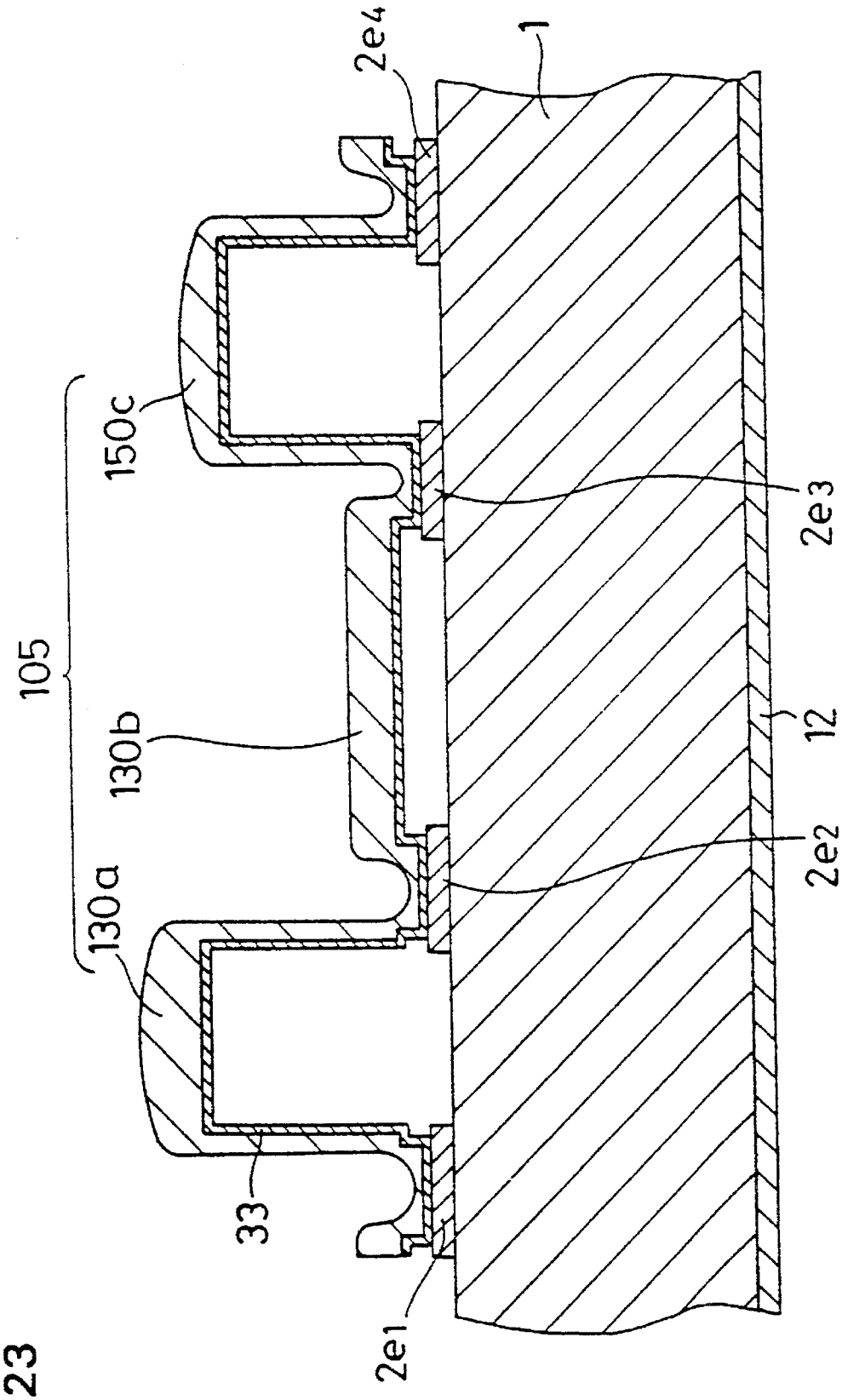
FIG. 23 is a sectional view illustrating a plurality of air-bridge wirings having different heights employed in a semiconductor device according to a fifth embodiment of the present invention.

FIG. 23 is a sectional view illustrating a part of a GaAs MMIC including a plurality of air-bridge wirings having different heights in accordance with a fifth embodiment of the present invention. In FIG. 23, reference numeral 1 designates a semi-insulating. GaAs substrate of the GaAs MMIC. First to fourth lower electrodes $2e_1$ to $2e_4$ are disposed on prescribed positions of the front surface of the substrate 1. In this fifth embodiment, the first lower electrode $2e_1$ is connected to the second lower electrode $2e_2$ through a relatively high first air-bridge wiring 130a, the second lower electrode $2e_2$ is connected to the third lower electrode $2e_3$ through a relatively low second air-bridge wiring 130b, and the third lower electrode $2e_3$ is connected to the fourth lower electrode $2e_4$ through a third air-bridge wiring 150c having an intermediate height between the first and second air-bridge wirings.

In this fifth embodiment of the invention, the first to third air-bridge wirings 130a, 130b, and 150c having different heights are united in an electroplated metal film 103.

A description is given of a method of producing the GaAs MMIC shown in FIG. 23, emphasizing process steps of producing the first to third air-bridge wirings. FIGS. 24(a) to 24(d) are sectional views illustrating process steps of forming first and second resist films as masks for selective electroplating and a feeding layer, and FIGS. 25(a) to 25(e) are sectional views illustrating process steps of forming the first to third air-bridge wirings having different heights by electroplating.

Figure 24A:
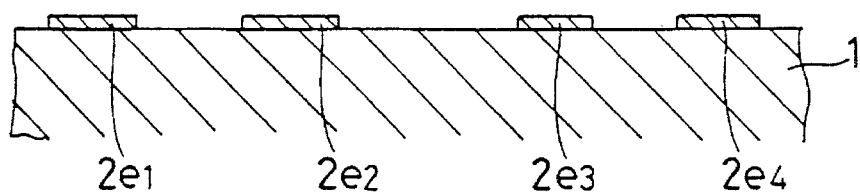
FIGS. 24(a)–24(d) and 25(a)–25(e) are sectional views illustrating process steps in a method of producing the structure shown in FIG. 23.
Figure 24B:
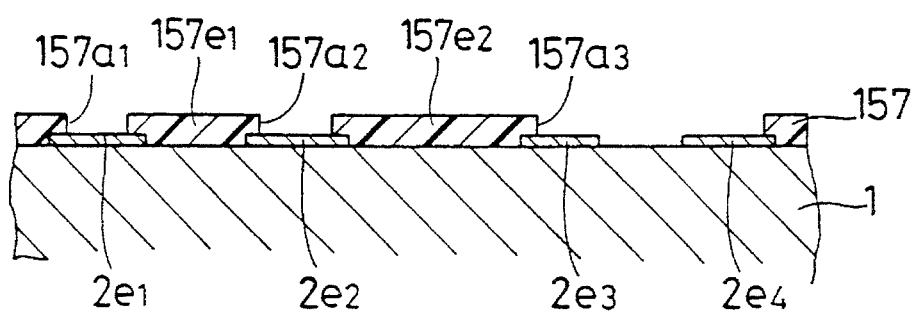

Initially, as illustrated in FIG. 24(a), on the GaAs substrate 1 having the lower electrodes $2e_1$ to $2e_4$ at the front surface, a positive type lower resist film 157 is deposited and patterned so that spacers $157e_1$ and $157e_2$ respectively corresponding to spaces under the air-bridge wirings 130a and 130b shown in FIG. 23 are left (FIG. 24(b)). In the step of FIG. 24(b), resist apertures $157a_1$ and $157a_2$ respectively corresponding to the first and second air-bridge wirings 130a and 130b are formed through portions of the lower resist film 157 opposite the lower electrodes $2e_1$ and $2e_2$. At the same time, a resist aperture $157a_3$ is formed opposite a region including the lower electrodes $2e_3$ and $2e_4$. That region corresponds to a region where the third air-bridge wiring 150c having the intermediate height is to be produced.

Figure 24C:
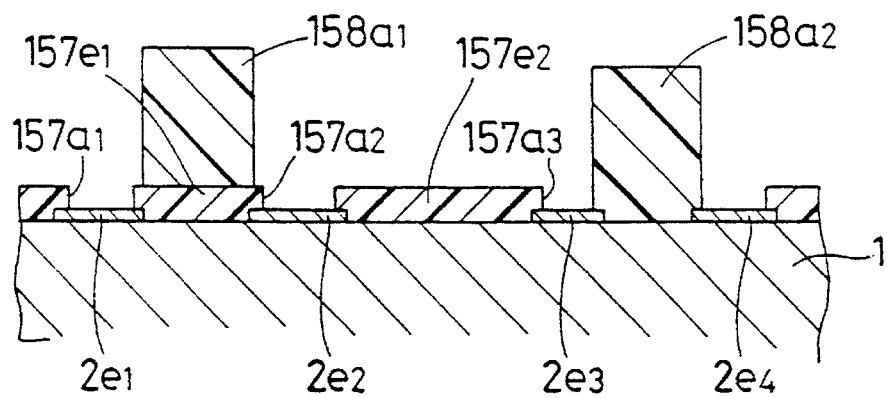
Figure 24D:
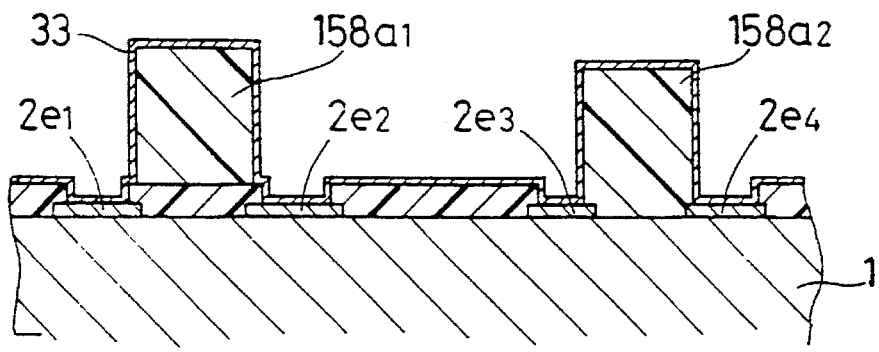

Thereafter, a second lower resist film for selective electroplating is deposited over the entire surface and patterned to form second spacers $158a_1$ and $158a_2$ on the spacer $157e_1$ and on a region between the lower electrodes $2e_3$ and $2e_4$, respectively (FIG. 24(c)). Subsequently, as in the above-described first embodiment, a lower feeding layer 33 having a three-layer structure of Ti/Mo/Au is formed by sputtering (FIG. 24(d)).

Figure 25A:
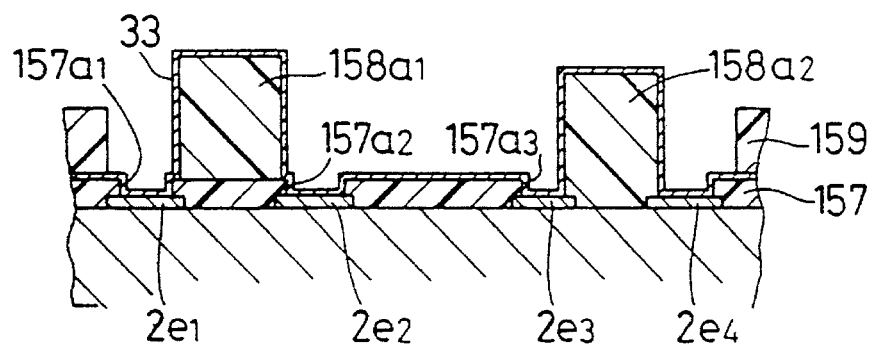

In the step of FIG. 25(a), an upper resist film 159 for selective plating is deposited over the entire surface to a prescribed thickness and patterned to form an aperture opposite a region from the first resist aperture $157a_1$ to the resist aperture $157a_3$.

Figure 25B:
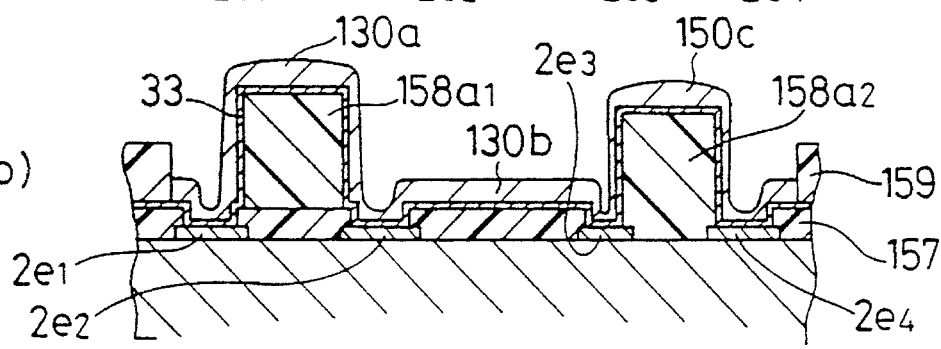

Thereafter, using the upper resist film 159 as a mask, a metal film 103 is selectively electroplated in the resist aperture 159a (FIG. 25(b)), whereby a relatively high air-bridge wiring 130a, a relatively low air-bridge wiring 130b, and an air-bridge wiring 150c having an intermediate height are simultaneously produced in the electroplated metal film 103.

Figure 25C:
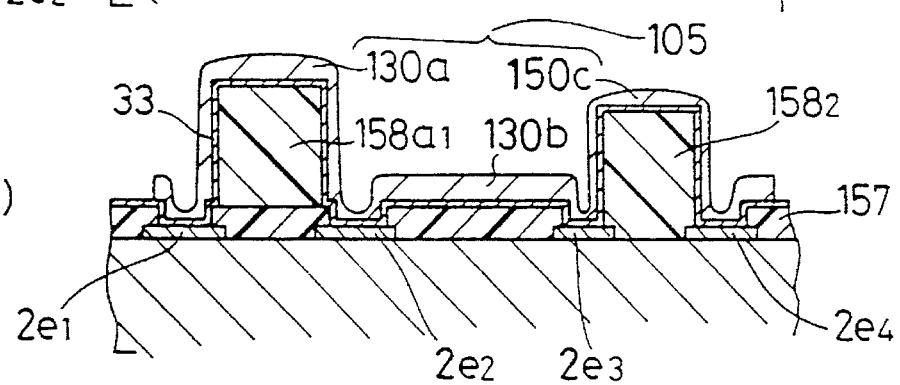
Figure 25D:
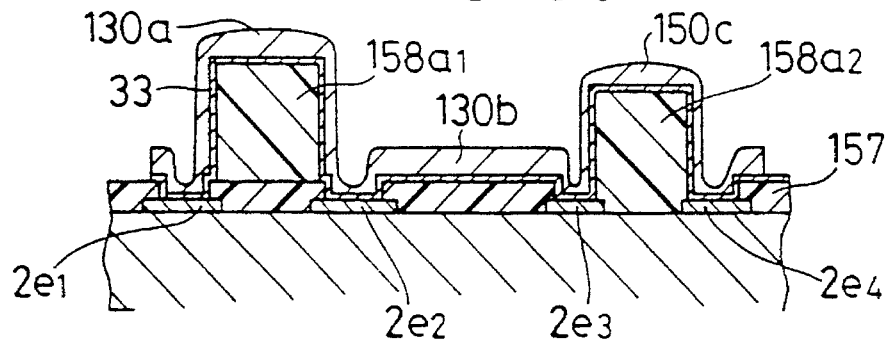
Figure 25E:
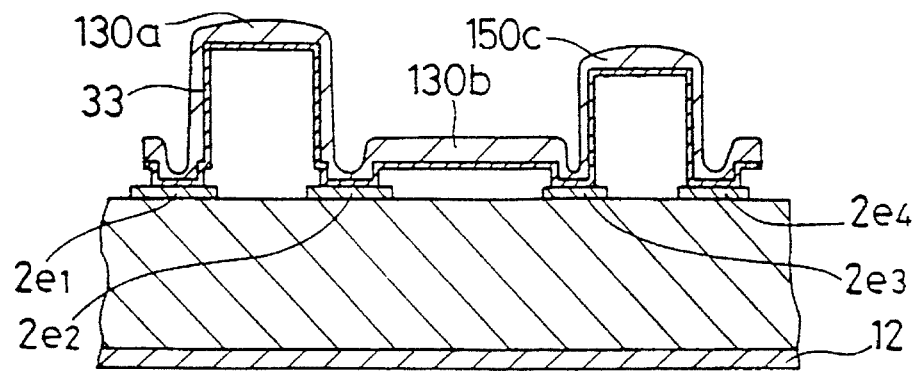

The upper resist film 159 is removed with a release solution (FIG. 25(c)), the feeding layer 33 is removed by ion milling (FIG. 25(d)), and the lower resist films $158a_1$, $158a_2$, and 157 are removed with a release solution. Thereafter, the rear surface of the substrate is etched, and a rear electrode 12 is formed on the etched surface to complete a GaAs MMIC (FIG. 25(e)).

In this fifth embodiment of the invention, when the air-bridge wirings are produced by selective electroplating, three kinds of spacers for producing spaces under the respective air-bridge wirings are formed by patterning the first and second resist films 157 and 158 having different thicknesses, so that the three air-bridge wirings 130a, 130b, and 150c having different heights are simultaneously produced.

What is claimed is:

1. A semiconductor device including:

a semiconductor substrate having opposite front and rear surfaces;

a plurality of lower electrodes disposed on the front surface of the substrate and a rear electrode disposed on the rear surface of the substrate;

an air-bridge wiring disposed on the front surface of the substrate connecting two of the lower electrodes;

a via-hole penetrating through the semiconductor substrate proximate the two lower electrodes connected by the air-bridge wiring; and a via-hole wiring disposed in the via-hole and connecting the two lower electrodes connected by the air-bridge wiring to the rear electrode wherein the air-bridge wiring and the via-hole wiring are a continuous, unitary electroplated metal film.

2. The semiconductor device of claim 1 wherein the air-bridge wiring has a height relative to the front surface of the substrate and the electroplated metal film has a height at the via-hole approximately equal to the height of the air-bridge wiring.

3. The semiconductor device of claim 1 including a feeding layer having a multilayer structure of different metals interposed between the electroplated metal film and the lower and rear electrodes connected to the electroplated metal film.

4. The semiconductor device of claim 3 wherein said feeding layer includes a barrier metal film that prevents reactive elements of the lower electrodes from diffusing into the air-bridge wiring.

5. A semiconductor device comprising:

a semiconductor substrate having opposite front and rear surfaces and a plurality of lower electrodes on the front surface;

an air-bridge wiring disposed on the front surface of the substrate connecting two of the lower electrodes; and an ordinary wiring disposed on the front surface of the substrate and connected to one of the lower electrodes wherein the air-bridge wiring and the ordinary wiring are a continuous, unitary electroplated metal film.

* * * * *